US012740109B2

(12) United States Patent
Chen et al.

(10) Patent No.: US 12,740,109 B2
(45) Date of Patent: Sep. 15, 2026

(54) DEVICE HAVING MG CONTACTS COUPLED BY MP CONTACT AND METHOD OF MANUFACTURING SAME

(71) Applicant: TAIWAN SEMICONDUCTOR MANUFACTURING COMPANY, LTD., Hsinchu (TW)

(72) Inventors: Yi-Yi Chen, Hsinchu (TW); Chi-Yu Lu, Hsinchu (TW); Chih-Liang Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 502 days.

(21) Appl. No.: 18/336,454

(22) Filed: Jun. 16, 2023

(65) Prior Publication Data

US 2024/0421187 A1 Dec. 19, 2024

(51) Int. Cl.
*H10D 30/67* (2025.01)
*H10D 30/01* (2025.01)
(Continued)

(52) U.S. Cl.
CPC ......... *H10D 62/121* (2025.01); *H10D 30/014* (2025.01); *H10D 30/43* (2025.01); *H10D 30/6729* (2025.01); *H10D 30/6735* (2025.01); *H10D 30/6757* (2025.01); *H10D 84/0128* (2025.01); *H10D 84/013* (2025.01); *H10D 84/038* (2025.01); *H10D 84/83* (2025.01); *H10W 20/20* (2026.01)

(58) Field of Classification Search
CPC .... H10D 62/121; H10D 30/014; H10D 30/43; H10D 30/6729; H10D 30/6735; H10D 30/6757; H10D 84/0128; H10D 84/013; H10D 84/038; H10D 84/83; H10D 30/6728; H10D 62/122; H10D 84/975; H10D 84/0149; H10D 84/016; H10D 84/837; H10D 89/10; H10W 20/20; B82Y 10/00
See application file for complete search history.

(56) References Cited

U.S. PATENT DOCUMENTS

2015/0370950 A1* 12/2015 Kawa ................ H10D 84/0195 716/119
2018/0122793 A1* 5/2018 Moroz .................. H10D 89/10
(Continued)

FOREIGN PATENT DOCUMENTS

TW 200537687 11/2005

*Primary Examiner* — Christine S. Kim
*Assistant Examiner* — Andrew Victor Prostor
(74) *Attorney, Agent, or Firm* — Hauptman Ham, LLP

(57) ABSTRACT

A semiconductor device (having a VFET architecture) includes: first and second active regions (ARs); first and second metal-to-gate (MG) contacts proximal to channel regions of the first and second ARs; metal-to-source/drain (MD) contacts and buried MD (BMD) contacts correspondingly coupled to first and second S/D regions correspondingly of the first and second ARs; and a metal-to-gate (MP) contact at a same level as the MG contacts, and extending between and coupling together the first and second MG contacts; and relative to a first direction, the first and second ARs being substantially aligned; and at least a portion of the MP contact extending substantially beyond each of the first and second ARs relative to a perpendicular second direction.

20 Claims, 22 Drawing Sheets

(51) Int. Cl.

| | |
|---|---|
| ***H10D 30/43*** | (2025.01) |
| ***H10D 62/10*** | (2025.01) |
| ***H10D 84/01*** | (2025.01) |
| ***H10D 84/03*** | (2025.01) |
| ***H10D 84/83*** | (2025.01) |
| ***H10W 20/20*** | (2026.01) |

(56) References Cited

U.S. PATENT DOCUMENTS

| | | | | |
|---|---|---|---|---|
| 2018/0315751 | A1* | 11/2018 | Schultz | H10D 84/907 |
| 2020/0235098 | A1* | 7/2020 | Li | H10D 30/6735 |
| 2021/0098500 | A1* | 4/2021 | Wang | H10D 84/0158 |
| 2022/0359678 | A1* | 11/2022 | Kim | H10D 30/6729 |
| 2023/0120551 | A1* | 4/2023 | Lee | H10D 30/6757<br>257/351 |

* cited by examiner

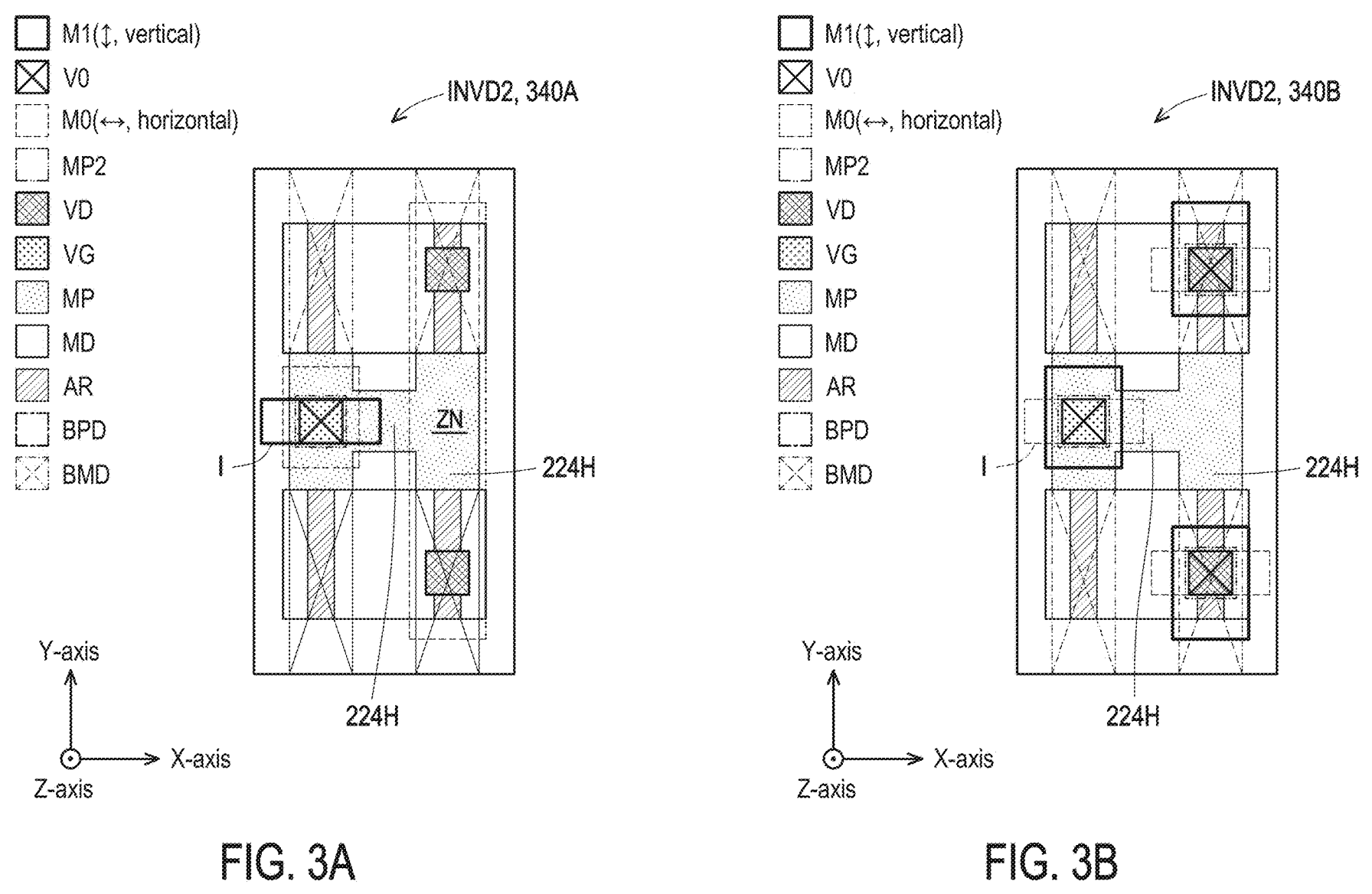

M1(↕, vertical)
V0
M0(↔, horizontal)
MP2
VD
VG
MP
MD
AR
BPD
BMD

INVD2, 340A

224H

ZN

224H

I

Y-axis
X-axis
Z-axis

FIG. 3A

M1(↕, vertical)
V0
M0(↔, horizontal)
MP2
VD
VG
MP
MD
AR
BPD
BMD

INVD2, 340B

224H

224H

I

Y-axis
X-axis
Z-axis

FIG. 3B

X-axis
Y-axis
Z-axis

M1(↕, vertical)
V0
M0(↔, horizontal)
MP2
VD
VG
MP
MD
AR
BPD
BMD

DEVICE HAVING MG CONTACTS COUPLED BY MP CONTACT AND METHOD OF MANUFACTURING SAME

BACKGROUND

The semiconductor integrated circuit (IC) industry produces a wide variety of analog and digital devices to address issues in a number of different areas. Developments in semiconductor process technology nodes have progressively reduced component sizes and tightened spacing resulting in progressively increased transistor density. ICs have become smaller.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 3A-3H are layout diagrams of corresponding semiconductor devices that include one or more stretched-MP contacts, in accordance with some embodiments.

DETAILED DESCRIPTION

Figure 1A:
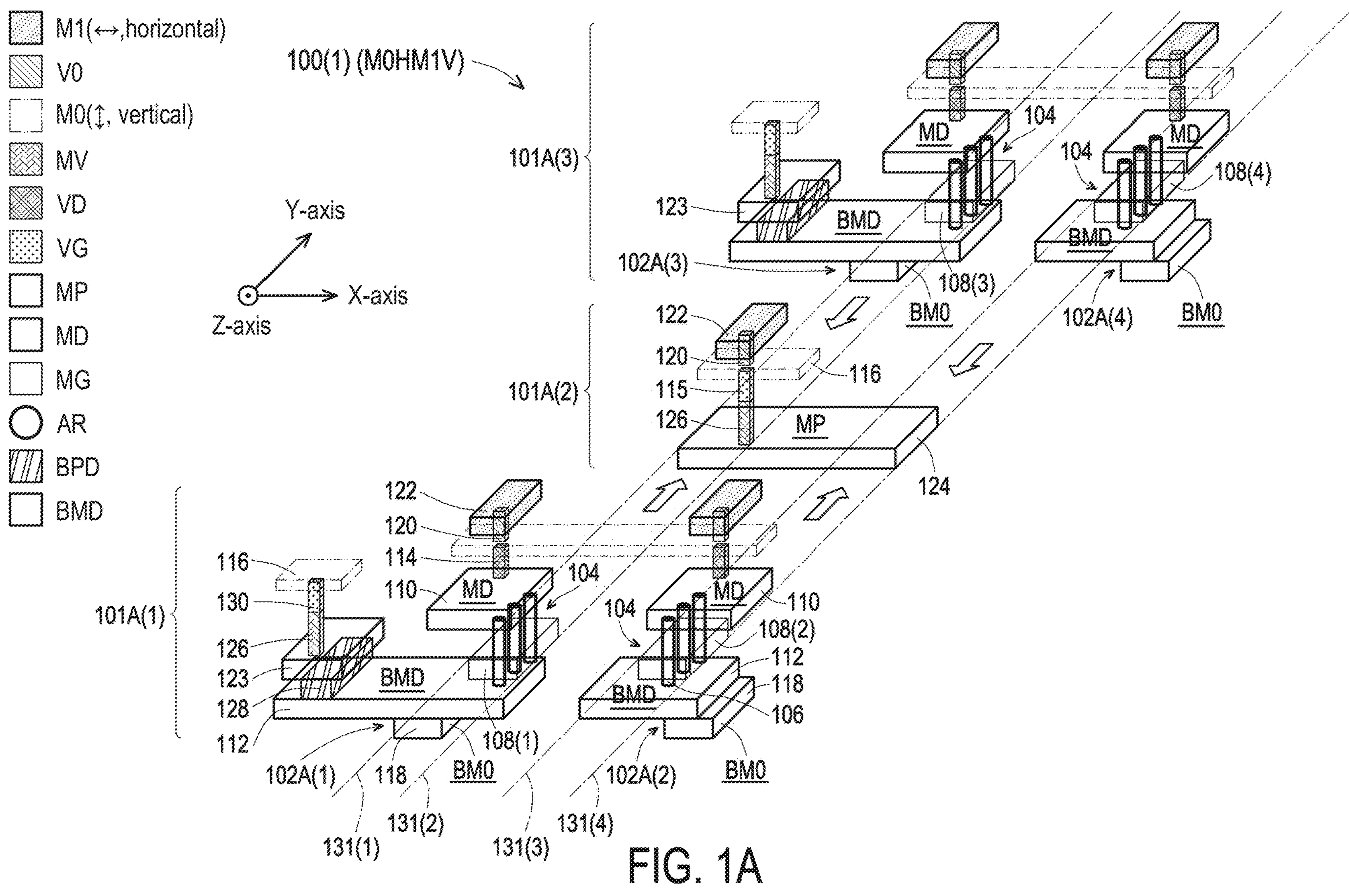
FIGS. 1A-1D are three-quarter perspective diagrams of corresponding semiconductor devices, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a semiconductor device includes metal-oxide field-effect transistors (MOSFETs) having a vertical architecture (VFETs), the semiconductor device including: metal-to-gate (MG) contacts including first and second MG contacts correspondingly proximal to channel regions of first and second active regions (ARs) correspondingly surrounded thereby; metal-to-source/drain (MD) contacts and buried MD (BMD) contacts correspondingly coupled to the first and second source/drain (S/D) regions correspondingly of the first and second ARs; and a metal-to-gate (MP) contact at a same level as the MG contacts, and extending between and coupling together the first and second MG contacts. The first and second ARs being substantially aligned relative to a first direction. At least a portion of the MP contact extending substantially beyond each of the first and second ARs relative to a perpendicular second direction such that the MP contact is a stretched-MP contact. The extended shape of the stretched-MP contact facilitates the stretched-MP contact being used to additionally one or more additional MG contacts or another component. According to another approach, at most, only a first MG contact and a second MG contact are coupled by an MP contact. Any additional coupling to the first and second MG contacts, e.g., to a third MG contact, or another component, must be routed through one or more segments in the first layer of metallization, which increases signal routing congestion in the first layer of metallization. By facilitating the stretched-MP contact being used to additionally one or more additional MG contacts or another component, the extended shape of the stretched-MP contact according to some embodiments reduces routing congestion as compared to the other approach.

Figure 1B:
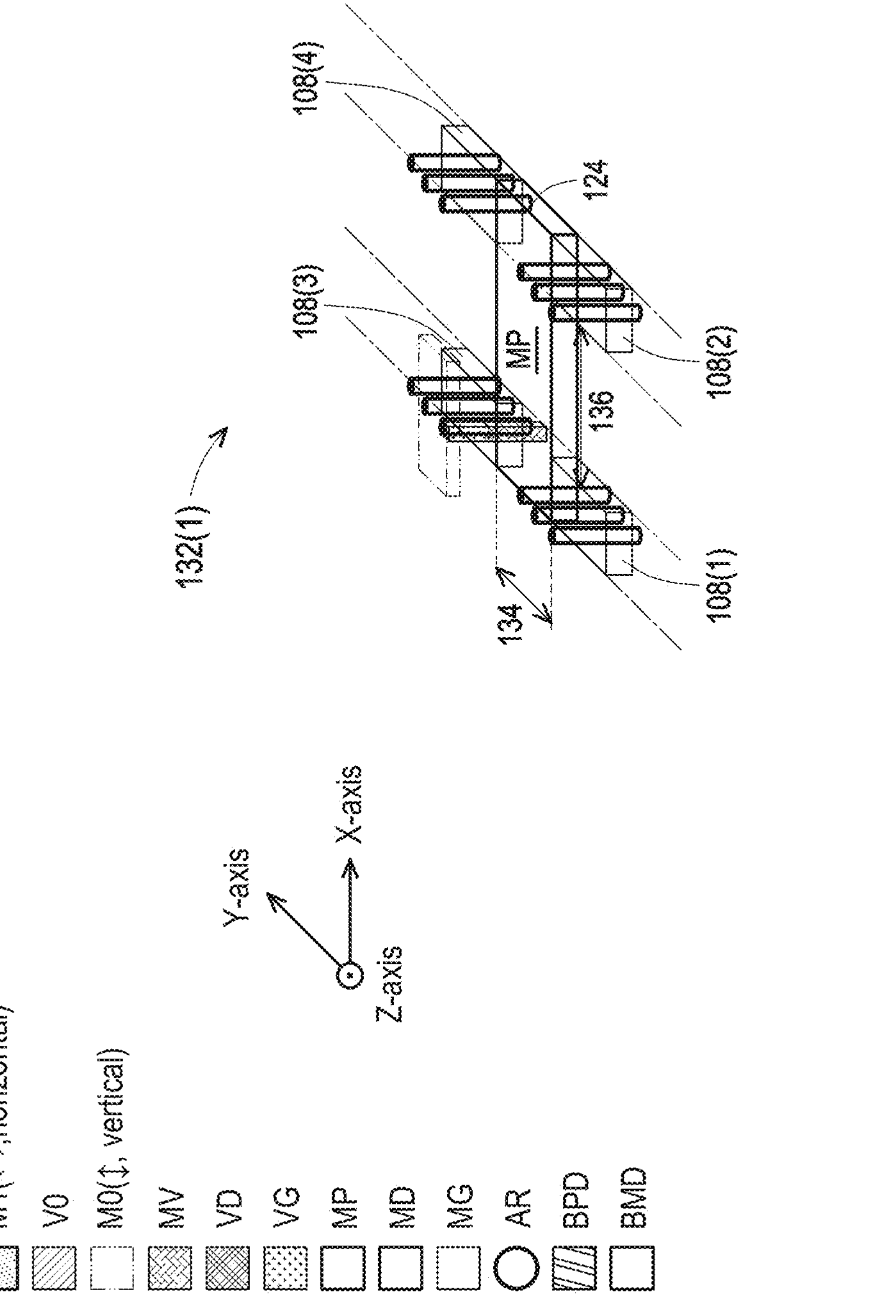
Figure 1C:
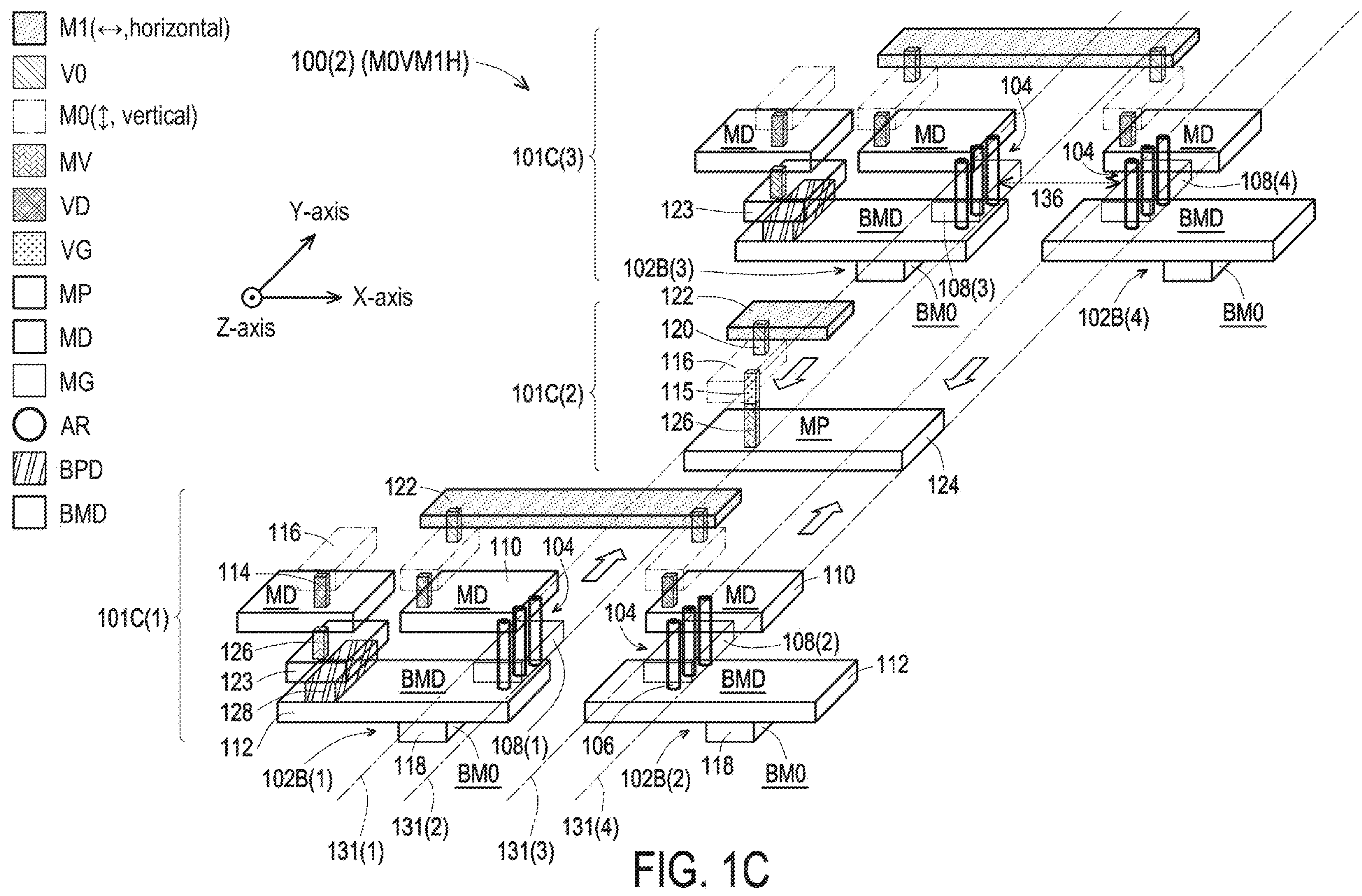

FIGS. 1A and 1C are exploded, three-quarter perspective diagrams of corresponding semiconductor devices 100(1) and 100(2), in accordance with some embodiments.

FIGS. 1A and 1C, and likewise FIGS. 1B and 1D (discussed below), assume first, second and third orthogonal directions that are, e.g., correspondingly parallel to the X-axis, Y-axis and Z-axis. Device 100(1) of FIG. 1A exhibits an M0HM1V architecture in which: a first layer of metallization, M0, has conductive segments with long axes that extend parallel to the X-axis; and a second layer of metallization, M1, has conductive segments with long axes that extend parallel to the Y-axis.

In FIGS. 1A-1D, and for likewise in other figures in the present document, a numbering convention is assumed in which the first layer of metallization, namely MET_1st, is labeled as M0, and correspondingly a first layer of interconnection (VIA_1st layer) is interconnection layer zero (VIA_0). Accordingly, segments in the MET_1st layer are M_1st segments M0 116. In some embodiments, depending upon the numbering convention of the corresponding process node by which device 100(1) is manufactured, the MET_1st layer is metallization layer one (M1) and correspondingly the VIA*1st layer is interconnection layer one (VIA1).

FIG. 1A is an exploded view relative to the Y-axis. As such, device 100(1) is divided into zones 101A(1), 101A(2) and 101A(3) that are separated relative to the Y-axis, where zone 101A(2) is between zones 101A(1) and 101A(3).

Each of zones 101A(1) and 101A(3) includes metal-oxide field-effect transistors (MOSFETs) having a vertical architecture (VFET), where such MOSFETs are referred to herein as VFETs. Zone 101A(1) includes VFETs 102A(1) and 102A(2). Zone 101A(3) includes VFETs 102A(3) and 102A (4).

VFET 102A(1) will be discussed as an example of VFETs 102A(1)-102A(4). VFET 102A(1) includes an instance of an active region 104. FIG. 1A assumes that each instance of AR 104 is comprised of instances of nanowire 106. In some embodiments, the instances of AR 104 is comprised of one or more nanosheets. Returning to VFET 102A(1), and relative to the Z-axis, a central region of the instance of AR 104 is surrounded by a metal-to-gate (MG) contact 108(1) with a suitable gate insulating layer (not shown) disposed therebetween.

Relative to the Z-axis, the portions of instances of nanowire 106 overlapped by MG contact 108(1) represent channel portions of instances of nanowire 106 which together represent a channel region of VFET 102A(1). Upper end regions of instances of nanowire 106 above MG contact 108(1) represent instances a first source/drain (S/D) region. Lower end regions of instances of nanowire 106 below MG contact 108(1) represent instances of a second S/D region. In some embodiments, the upper and lower end regions of nanowires are doped with impurities to form the instances of the corresponding first and second S/D regions.

Whereas VFET 102A(1) includes MG contact 108(1), VFET 102A(2) in zone 101A(1) includes MG contact 108 (2). In zone 101A(3), similarly, VFET 102A(3) includes MG contact 108(3) and VFET 102A(4) includes MG contact 108(4).

Returning to VFET 102A(1), the upper ends of instances of nanowire 106 abut and are coupled to an instance of an MD contact 110. The alphabetic text string, MD, serves as a convenient label. In some embodiments, MD is an acronym for metal-to-S/D. Relative to the Z-axis, there is a gap between the instance of MD contact 110 and MG contact 108(1). The lower ends of instances of nanowire 106 abut and are coupled to first end region of an instance of a BMD contact 112. The instance of BMD contact 112 and the instance of MD contact 110 are on opposite sides of MG contact 108(1). The alphabetic text string, BMD, serves as a convenient label. In some embodiments, BMD is an acronym for buried MD, where MD is an acronym for metal-to-S/D. In such embodiments, the adjective, buried, is intended to connote that instances of BMD contact 112 are below the instance of AR 104 relative to the Z-axis. Relative to the Z-axis, there is a gap between the instance of BMD contact 112 and MG contact 108(1).

In FIG. 1A, regarding VFET 102A(1), on and coupled to MD contact 110 is an instance of a VD contact 114. The alphabetic text string, VD, serves as a convenient label. In some embodiments, VMD is an acronym for via-to-MD. An instance of conductive M0 segment 116 in first layer of metallization M0 is on and coupled to the instance of VD contact 114. An instance of V0 contact 120 is on and coupled to the instance of M0 segment 116. The alphabetic text string, V0, serves as a convenient label. In some embodiments, V0 is an acronym for VIA0-to-M0. An instance of conductive M1 segment 122 in a layer of metallization M1 is on and coupled to the instance of V0 120.

In FIG. 1A, VFET 102A(1), and similarly regarding VFET 102A(3), have additional structures coupled thereto which are not correspondingly coupled to VFET 102A(2) nor VFET 102A(4). Regarding VFET 102A(1), under and coupled to the instance of BMD 112, an instance of a conductive buried segment 118 in a first buried layer of metallization BMO. An instance of a BPD contact 128 is on and coupled to the instance of BMD contact 112. The alphabetic text string, BPD, serves as a convenient label. In some embodiments, BPD is an acronym for buried PD, where PD is an acronym for MP-to-BMD.

Regarding VFET 102A(1), an instance of a basic-MP contact 123 is on and coupled to the instance of BPD contact 128. The alphabetic text string, MP, serves as a convenient label. In some embodiments, MP is an acronym for metal-to-poly because, historically, counterpart contacts were used to couple a metallization segment to a gate segment where, historically, gates segments were at one time typically formed of polysilicon. Here, basic-MP contact is a first type of MP contact, whereas a stretched-MP contact 124 (discussed below) is a second type of MP contact. The adjectives, basic and stretched, are convenient labels to apply correspondingly to MP contacts 123 and 124. The instance of basic-MP contact 123 is formed in the same layer is MG contact 108(1).

In FIG. 1A, regarding VFET 102A(1), an instance of an MV contact 126 is on and coupled to the instance of basic-MP contact 123. The alphabetic text string, MV, serves as a convenient label. In some embodiments, MV is an acronym for VG-to-MP, where VG is discussed below. An instance of VG 130 is on and coupled to the instance of MV contact 126. The alphabetic text string, VG, serves as a convenient label. In some embodiments, VG is an acronym for via-to-gate. An instance of conductive M0 segment 116 in first layer of metallization M0 is on and coupled to VG 130.

In FIG. 1A, long axes of instances of nanowire 106 extend parallel to the Z-axis. As such, a channel axis of each instance of AR 104 extends parallel to the Z-axis. Each instance of AR 104 has a width axis extending parallel to the Y-axis, and a thickness axis extending parallel to the X-axis.

Zone 101A(2) of FIG. 1A includes stretched-MP contact 124. In terms of zones 101A(1)-101A(3) relative to each other, reference lines 131(1), 131(2), 131(3) and 131(4) are shown in FIG. 1A as extending parallel to the Y-axis. An upper left edge of each of MG contact 108(1) of zone 101A(1), stretched-MP contact 124 of zone 101A(2) and MG contact 108(3) of zone 101A(3) is aligned to reference line 131(1). A lower right edge of each of MG contact 108(1) of zone 101A(1) and MG contact 108(3) of zone 101A(3) is aligned to reference line 131(2). An upper left edge of each of MG contact 108(2) of zone 101A(1) and MG contact 108(4) of zone 101A(3) is aligned to reference line 131(3). A lower right edge of each of MG contact 108(2) of zone 101A(1), stretched-MP contact 124 of zone 101A(2) and MG contact 108(4) of zone 101A(3) is aligned to reference line 131(4).

As the lower right edge of each of MG contact 108(2), stretched-MP contact 124 and MG contact 108(4) is aligned to reference line 131(4), at least a portion of stretched-MP contact 124 extends substantially beyond each of the instance of AR 104 associated with MG contact 108(1) and the instance of AR 104 associated with MG contact 108(3) relative to the X-axis. Furthermore, at least a portion of stretched-MP contact 124 overlaps each of the instance of AR 104 associated with MG contact 108(2) and the instance of AR 104 associated with MG contact 108(4) relative to the X-axis.

In addition to stretched-MP contact 124, zone 101A(2) further includes the following: an instance of an MV contact 126 on and coupled to stretched-MP contact 123; an instance of VG 130 is on and coupled to the instance of MV contact 126; an instance of M0 segment 116 is on and coupled to VG 130; an instance of V0 contact 120 is on and coupled to the instance of M0 segment 116; and an instance of M1 segment 122 is on and coupled to the instance of V0 120.

Before discussing FIG. 1B, FIG. 1C will be briefly discussed. FIG. 1C is similar to FIG. 1A. For brevity, the discussion will focus more on differences between FIG. 1C and FIG. 1A than on similarities. Regarding FIG. 1C, device 100(2) exhibits an M0VM1H architecture whereas device 100(1) of FIG. 1A exhibits the M0HM1V architecture. According to the M0VM1H architecture of device 100(2) of FIG. 1C: the first layer of metallization, M0, has segments with long axes that extend parallel to the Y-axis; and the second layer of metallization, M1, has segments with long axes that extend parallel to the X-axis. Device 100(2) is divided into zones 101C(1), 101C(2) and 101C(3) that are separated relative to the Y-axis, where zone 101C(2) is between zones 101C(1) and 101C(3).

Figure 1D:
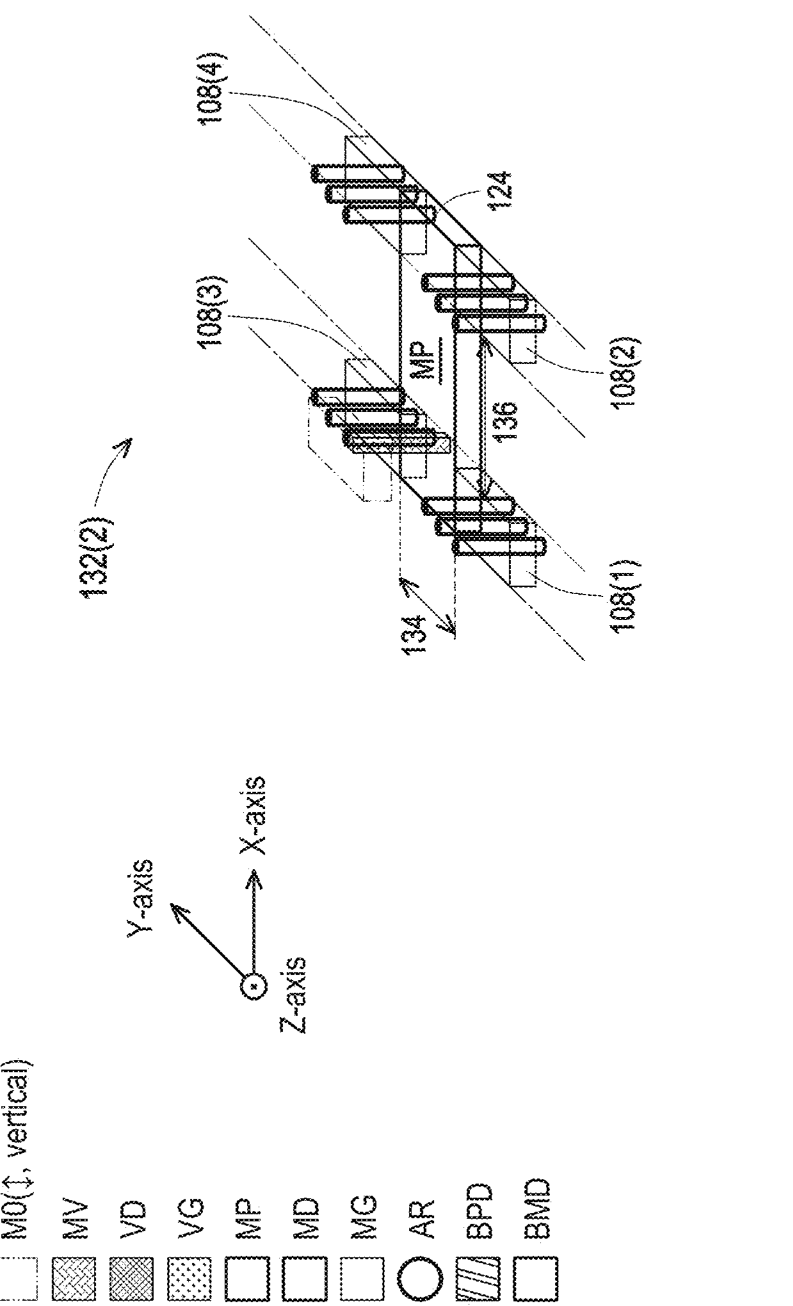

FIGS. 1B and 1D are simplified versions of corresponding FIGS. 1A and 1C, in accordance with some embodiments.

More particularly, FIGS. 1B and 2D are three-quarter perspective diagrams of corresponding stretch-coupling regions 132(1) and 132(2) that are coupled correspondingly by stretched-MP contacts 124 of semiconductor devices 100(1) and 100(2), in accordance with some embodiments.

Each of stretch-coupling regions 132(1) and 132(2) includes: stretched-MP contact 124: the corresponding instance of MV contact 126; the corresponding instance of VG 130; the corresponding instance of M0 segment 116; the corresponding instance of V0 contact 120; the corresponding instance of M1 segment 122; and MG contacts 108(1)-108(4). As device 100(1) of FIG. 1A has the M0HM1V architecture, the instance of M1 segment 122 in stretch-coupling region 132(1) of FIG. 1B has a long axis that extends parallel to the X-axis. As device 100(2) of FIG. 1C has the M0VM1H architecture, the instance of M1 segment 122 in stretch-coupling region 132(2) of FIG. 1D has a long axis that extends parallel to the Y-axis.

In each of FIGS. 1B and 1D, stretched-MP contact 124 couples each of MG contacts 108(1)-108(4) to each other. Stretched-MP contact 124 provides couplings relative to the Y-axis, e.g., by coupling MG contact 108(1) to MG contact 108(3), by coupling MG contact 108(1) to MG contact 108(4), by coupling MG contact 108(3) to MG contact 108(2), or by coupling MG contact 108(2) to MG contact 108(4). Stretched-MP contact 124 provides couplings relative to the X-axis, e.g., by coupling MG contact 108(1) to MG contact 108(2), by coupling MG contact 108(1) to MG contact 108(4), by coupling MG contact 108(3) to MG contact 108(4), or by coupling MG contact 108(3) to MG contact 108(2).

Figure 2A:
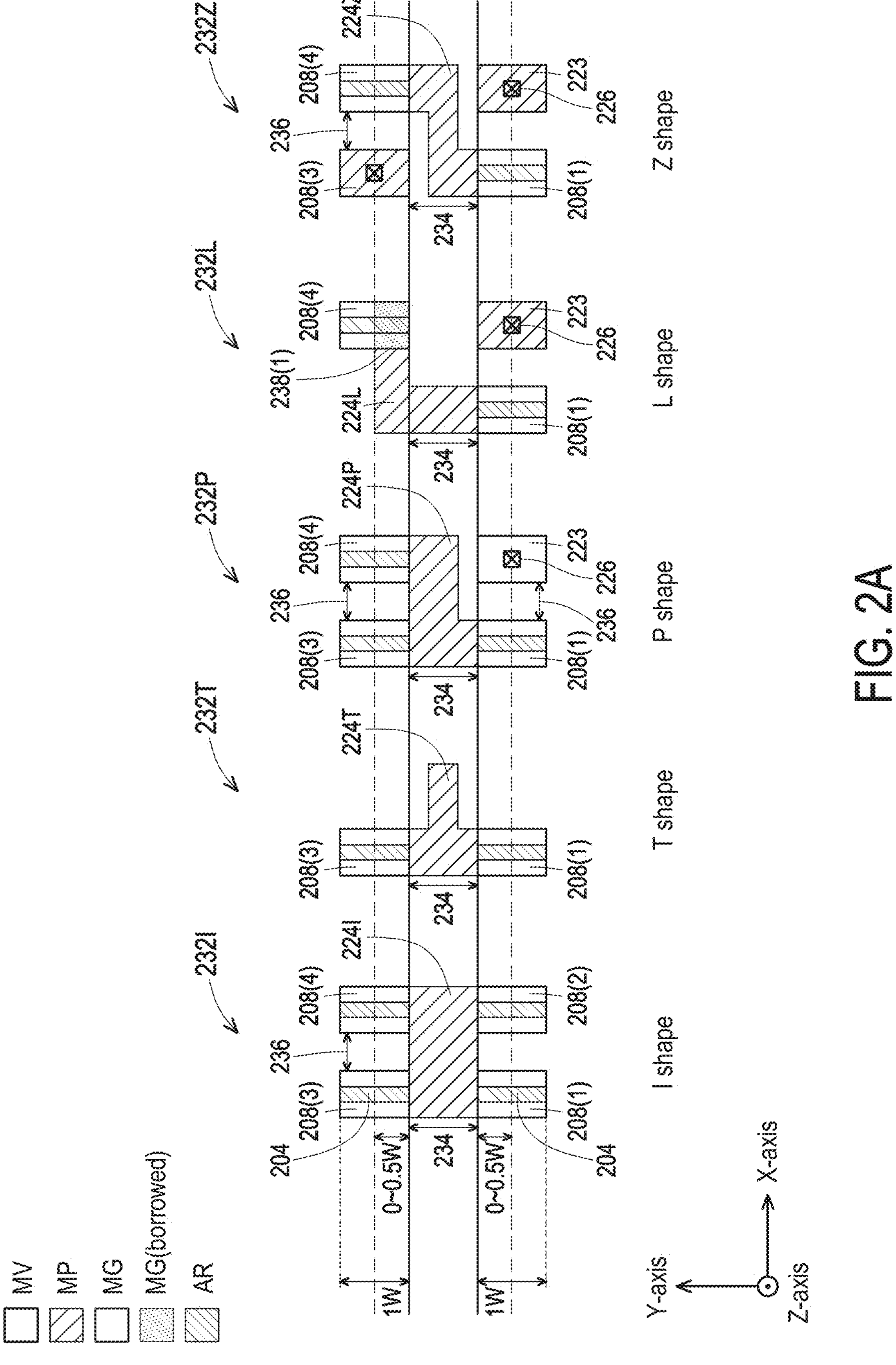
FIG. 2A-2B are layout diagrams of corresponding stretch-coupling regions, in accordance with some embodiments.
Figure 2B:
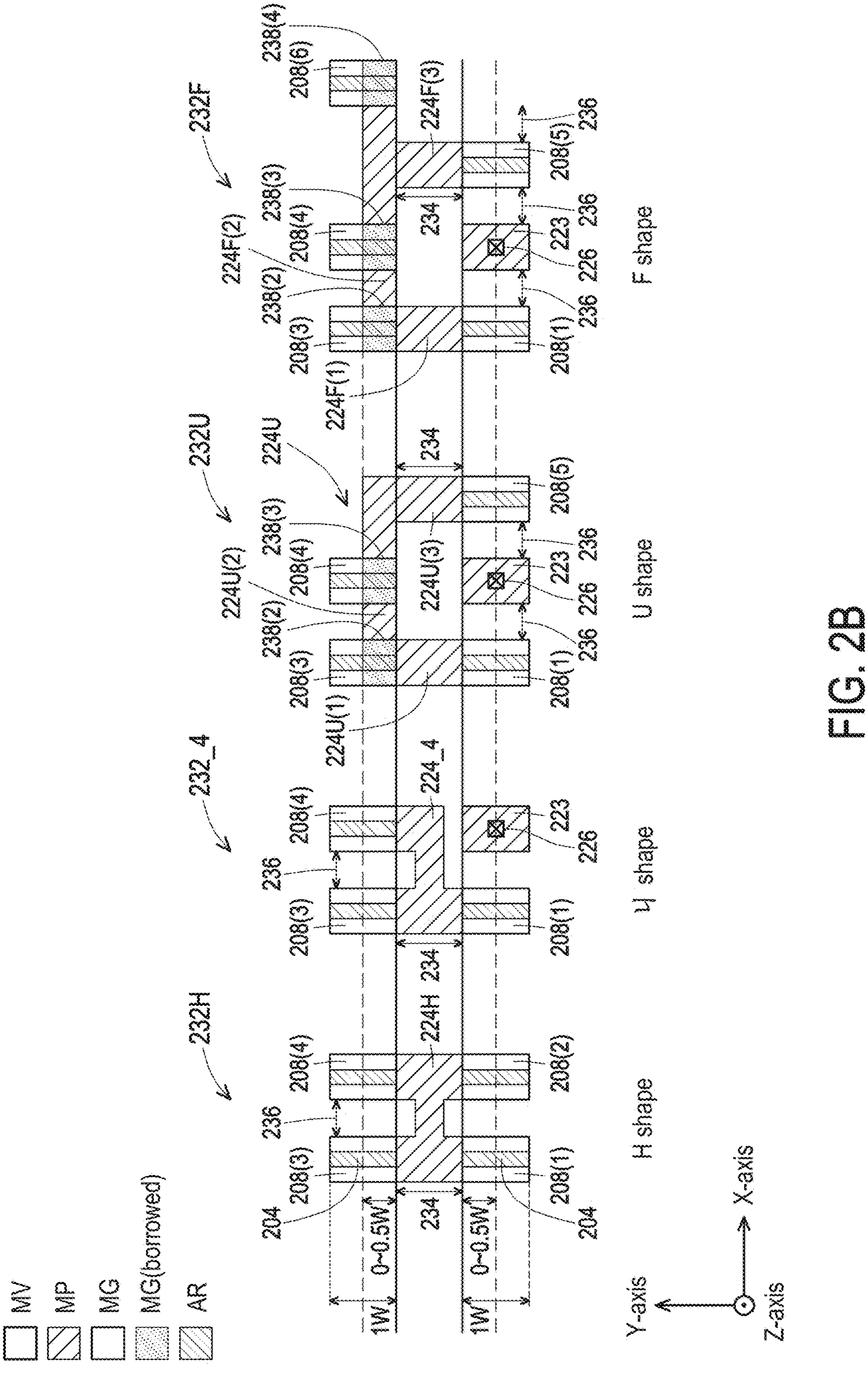
Figure 3C:
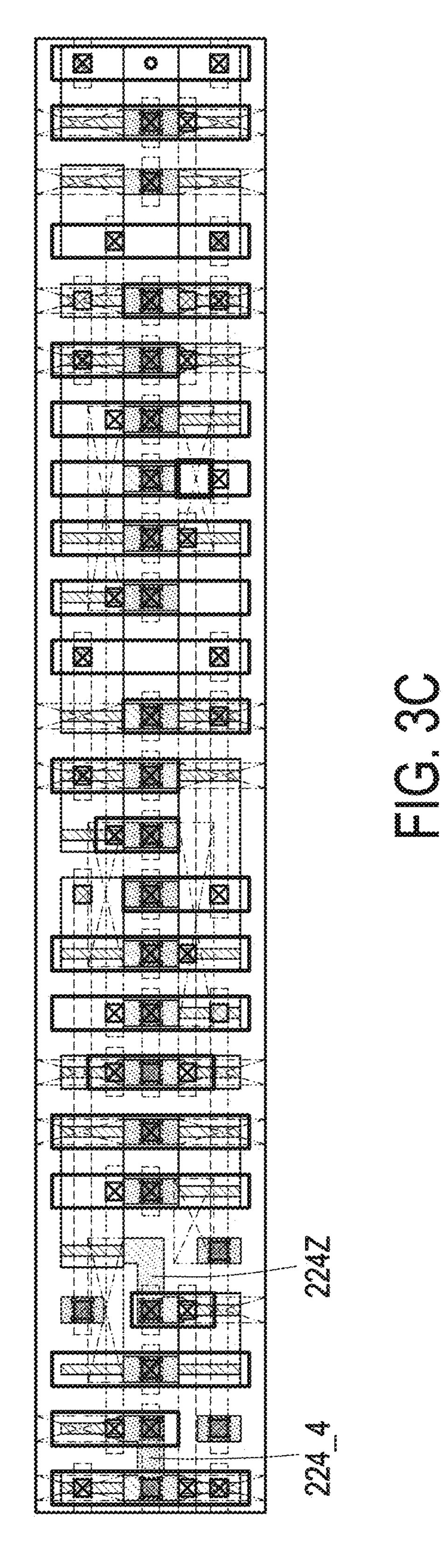
Figure 3C:
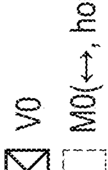
Figure 3C:
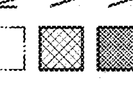
Figure 3C:
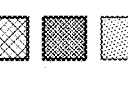
Figure 3C:
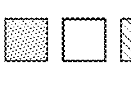
Figure 3C:
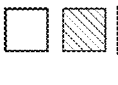
Figure 3D:
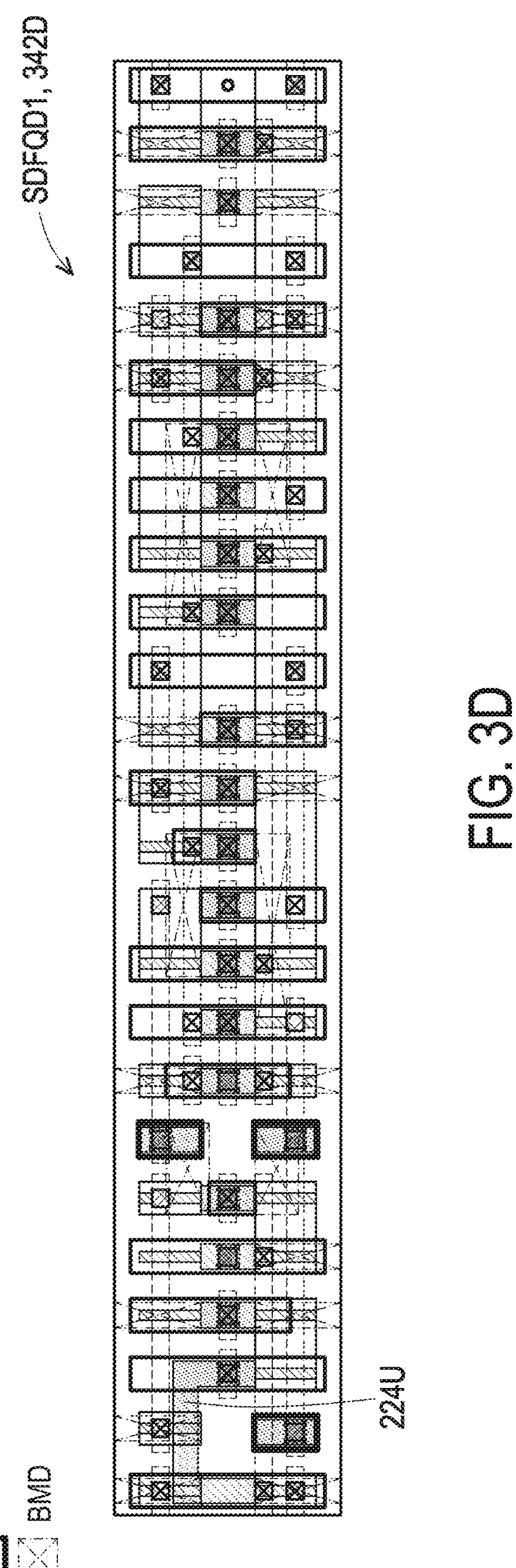
Figure 3D:
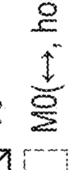
Figure 3D:
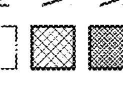
Figure 3D:
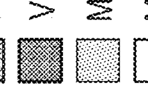
Figure 3D:
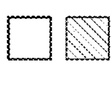
Figure 3D:
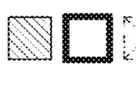
Figure 3E:
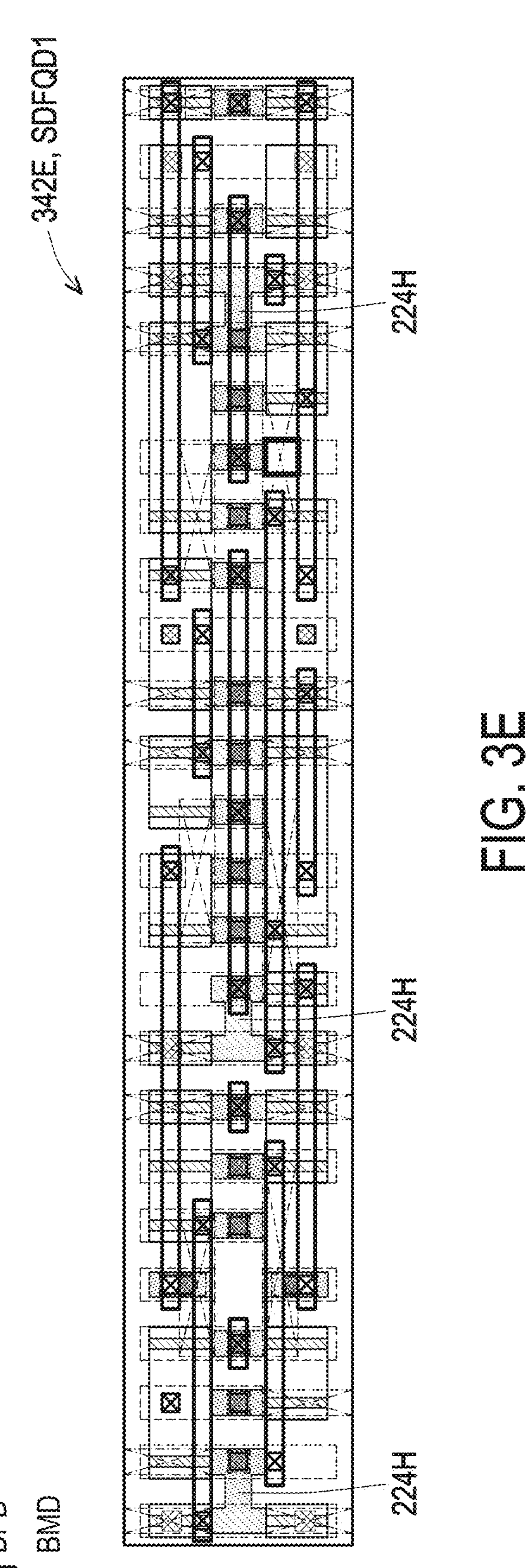
Figure 3F:
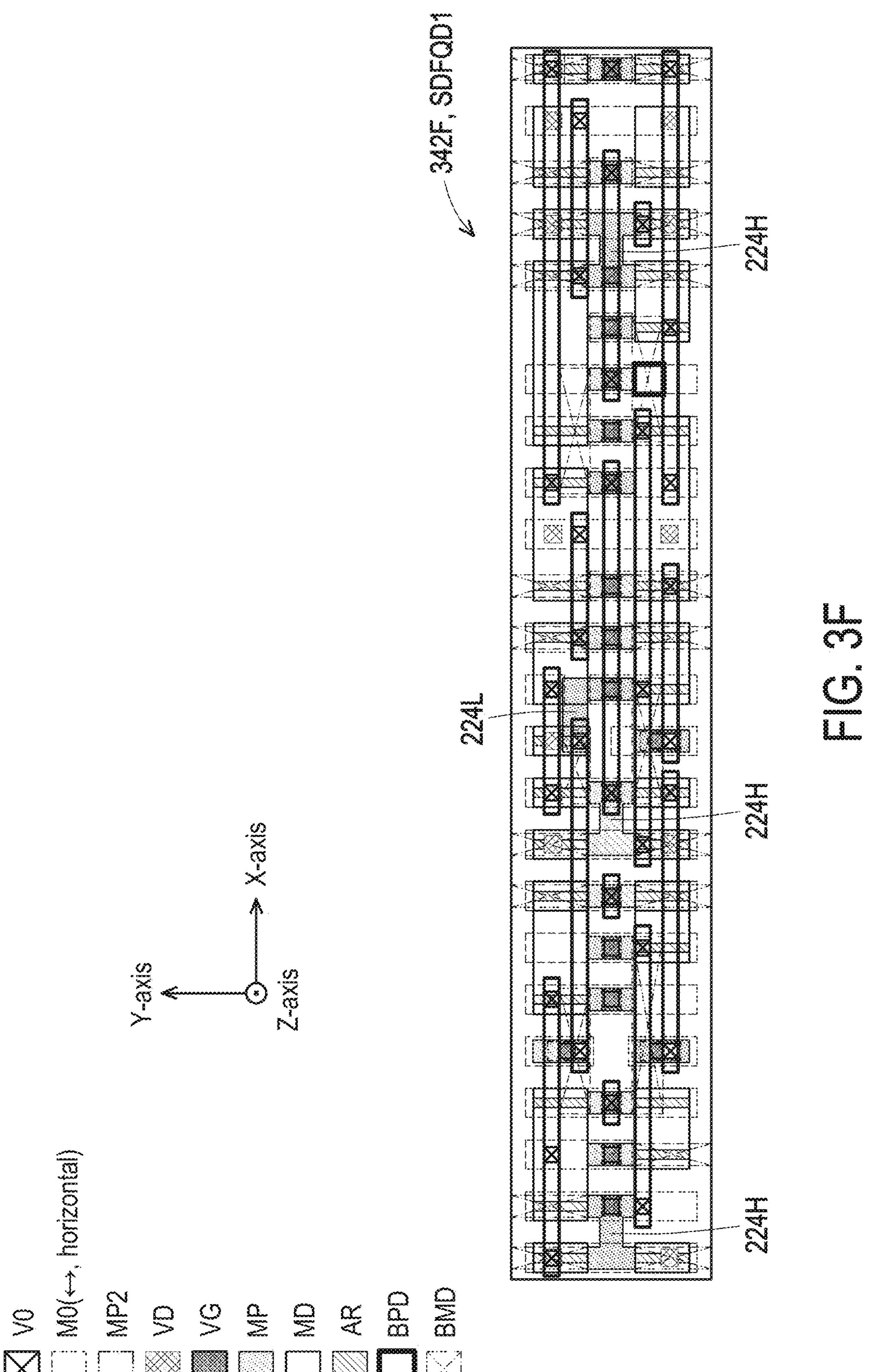
Figure 3G:
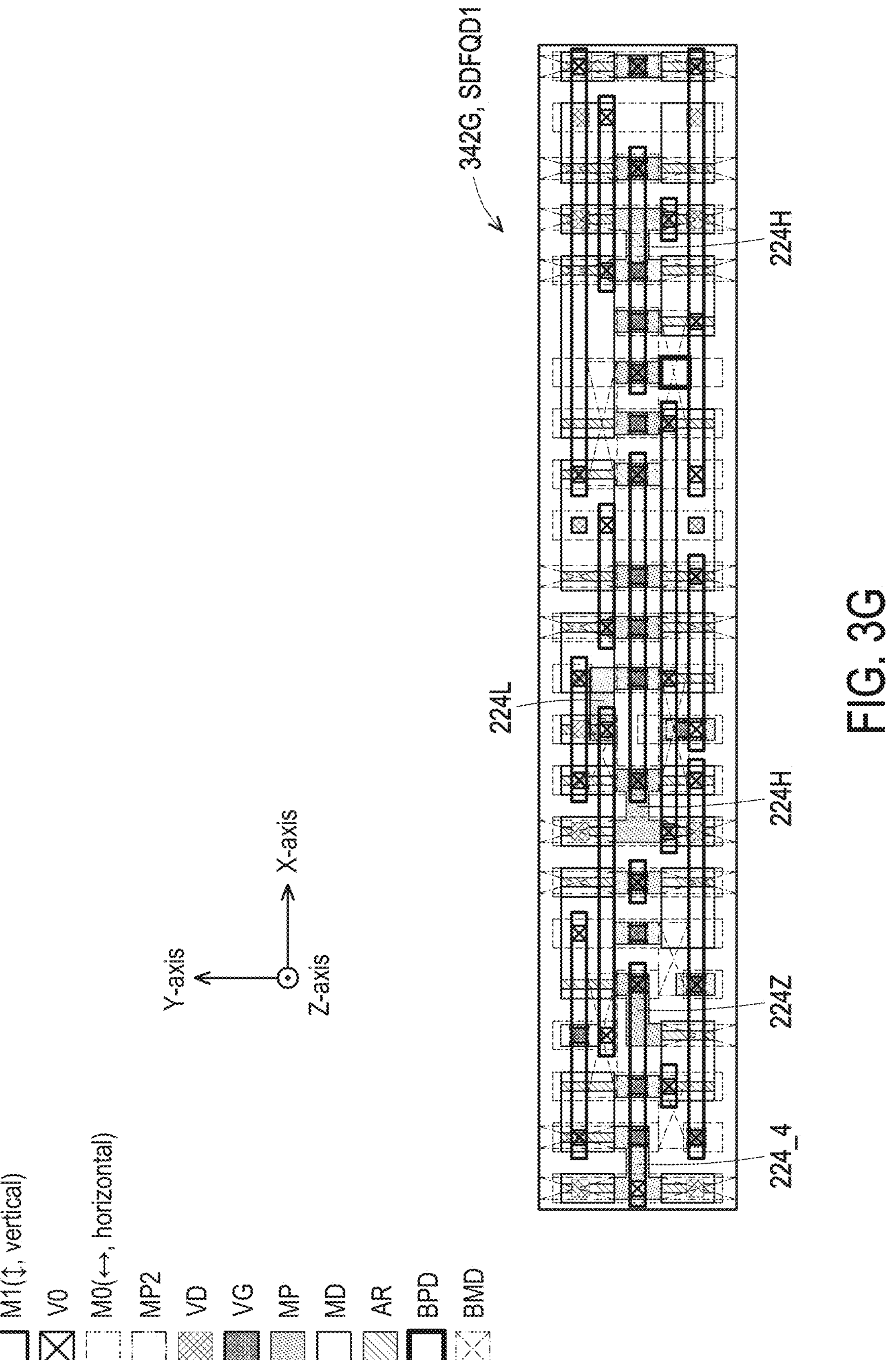
Figure 3H:
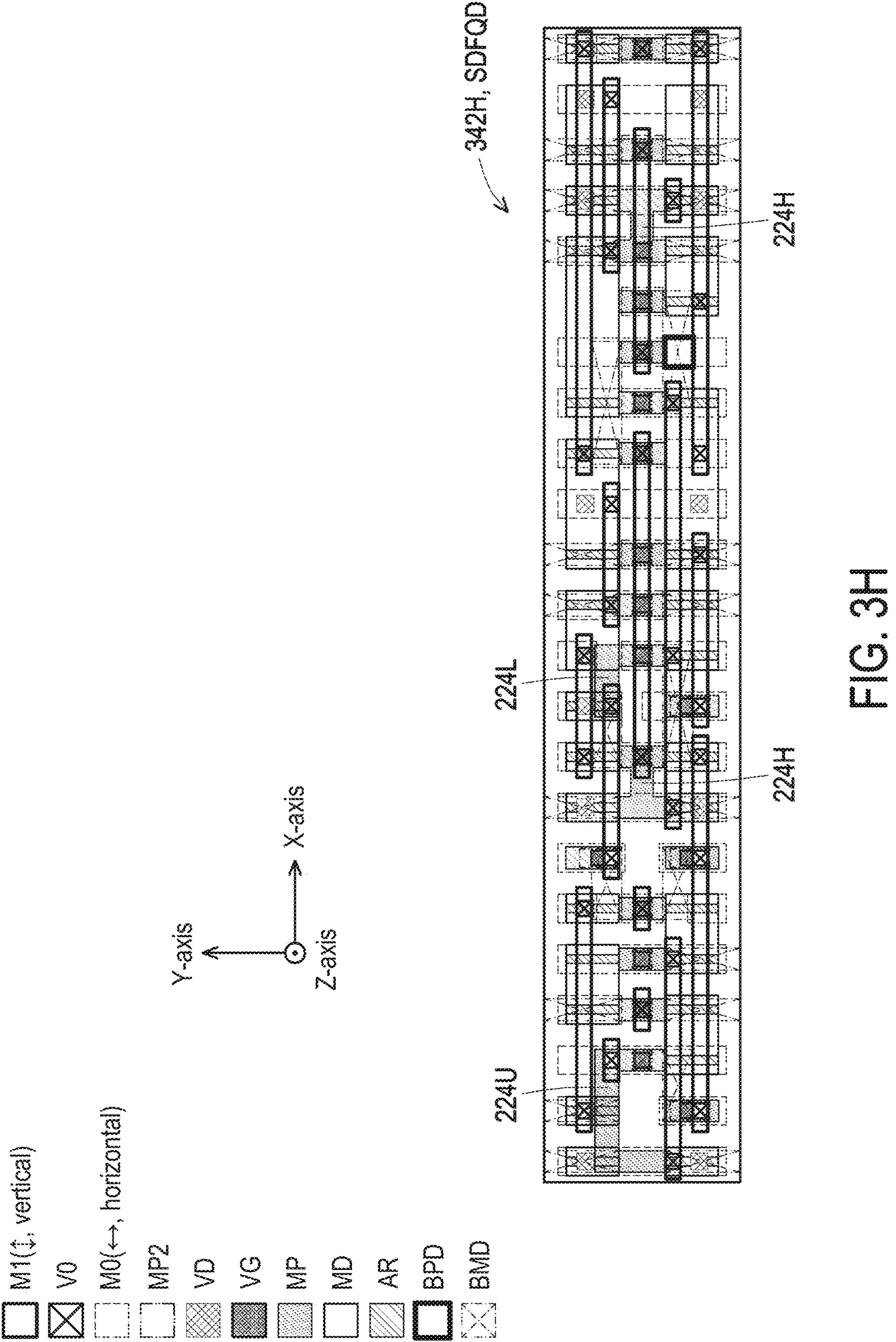

FIGS. 2A-2B include layout diagrams correspondingly of stretch-coupling regions (A) FIG. 2A) 232I, 232T, 232P, 232L and 232Z, and (B) 232H, 232_4, 232U and 232F, in accordance with some embodiments.

Each of the stretch-coupling regions of FIGS. 2A-2B is an example of stretch-coupling region 132(1) of FIG. 1B or stretch-coupling region 132(2) of FIG. 1D. The layout diagrams of FIGS. 2A-2B follow a similar numbering scheme to that of FIGS. 1B and 1D. FIGS. 2A-2B assume first, second and third orthogonal directions that are, e.g., correspondingly parallel to the X-axis, Y-axis and Z-axis.

Stretch-coupling region 232I includes: stretched-MP contact 224I; and MG contacts 208(1), 208(2), 208(3) and 208(4) that surround corresponding instances of an AR 204.

Stretched-MP contact 224I has an I-shape, i.e., has a shape that resembles an upper case letter I. In some embodiments, an uppercase letter I is described as having only a stem. In some embodiments, an uppercase letter I is described as having a stem and truncated upper and lower arms the central regions of which are intersected by the stem. In a default orientation of an uppercase letter I, the long axis of the stem of the uppercase letter I extends parallel to the Y-axis. In stretch-coupling region 232I, the long axis of stretched-MP contact 224I, i.e., of the stem of the uppercase letter I, has been rotated 90 degrees (90°) either clockwise or counterclockwise relative to the long axis of the stem of an uppercase letter I having the default orientation. In some embodiments, stretched-MP contact 224I is referred to as a tetragon, a rectangle or a quadrilateral polygon. Stretched-MP contact 224I is an example of a convex polygon.

I-shape stretched-MP contact 224I: extends between MG contacts 208(1) and 208(3); extends between MG contacts 208(2) and 208(4); and couples MG contacts 208(1)-208(4) to each other.

MG contacts 208(1) and 208(3) are aligned relative to the X-axis. MG contacts 208(2) and 208(4) are aligned relative to the X-axis. MG contacts 208(1) and 208(2) are aligned relative to the Y-axis. MG contacts 208(3) and 208(4) are aligned relative to the Y-axis.

In stretch-coupling region 232I, the centerline of an instance of AR 204 is parallel to the Y-axis. The centerline-to-centerline distance between the instances of AR 204 that are correspondingly surrounded by MG contacts 208(3) and 208(4), i.e., the pitch therebetween, has a value of 1*P, where P represents uniform centerline-to-centerline distance between adjacent instances of AR 204 for the corresponding semiconductor process technology node. The pitch between instances of AR 204 that are correspondingly surrounded by MG contacts 208(3) and 208(4) is 1*P. In some embodiments, the pitch between instances of AR 204 that are correspondingly surrounded by MG contacts 208(3) and 208(4) is N*P, where N is a positive integer and 2≤N. The pitch between instances of AR 204 that are correspondingly surrounded by MG contacts 208(3) and 208(4). In some embodiments, the pitch between instances of AR 204 that are correspondingly surrounded by MG contacts 208(3) and 208(4) is N*P, where N is a positive integer and 2≤N. In some embodiments, the pitch between instances of AR 204 that are correspondingly surrounded by MG contacts 208(3) and 208(4) is N*P.

MG contacts 208(1) and 208(3) are separated by a gap 234 relative to the Y-axis. MG contacts 208(1) and 208(4) are separated by gap 234 relative to the Y-axis. MG contacts 208(2) and 208(4) are separated by gap 234 relative to the Y-axis. MG contacts 208(3) and 208(2) are separated by gap 234 relative to the Y-axis.

In FIGS. 2A-2B, gap 234 has a size W, which is a uniform distance for the corresponding semiconductor process technology node. In some embodiments, W represents the size of a smallest AR 204 that is produced by the corresponding semiconductor process technology node.

MG contacts 208(1) and 208(2) are separated by a gap 236 relative to the X-axis. MG contacts 208(1) and 208(4) are separated by gap 236 relative to the X-axis. MG contacts

208(3) and 208(2) are separated by gap 236 relative to the X-axis. MG contacts 208(3) and 208(4) are separated by gap 236 relative to the X-axis.

In FIG. 2A, stretch-coupling region 232T includes: stretched-MP contact 224T; and MG contacts 208(1) and 208(3) that surround corresponding instances of an AR 204. As compared to stretch-coupling region 232I, stretch-coupling region 232T is missing MG contacts 208(2) and 208(4), and the instances of AR 204 surrounded thereby.

Stretched-MP contact 224T has a T-shape, i.e., has a shape that resembles an upper case letter T. An uppercase letter T has a stem that intersects a central region of an arm. In a default orientation of an uppercase letter T, the long axis of the stem of the uppercase letter T extends parallel to the Y-axis and a long axis of the arm extends parallel to X-axis. The arm intersects a first end of the stem. In stretch-coupling region 232T, the T-shape of MP contact 224T has a first orientation which is rotated about 90 degrees counterclockwise relative to the default orientation of the T-shape.

The arm of T-shape stretched-MP contact 224T couples MG contacts 208(1) and 208(3). The stem of the T-shape stretched-MP contact 224T extends substantially beyond each of MG contacts 208(2) and 208(4) relative to the X-axis. In some embodiments, stretched-MP contact 224T is described as an octagon. In some embodiments, stretched-MP contact 224T is described as a concave polygon.

In FIG. 2A, stretch-coupling region 232P includes: stretched-MP contact 224P; MG contacts 208(1), 208(3) and 208(4) that surround corresponding instances of an AR 204; an instance of basic-MP contact 223; and an instance of an MV contact 226 over the instance of basic-MP contact 223. As compared to stretch-coupling region 232I, stretch-coupling region 232T is missing MG contact 208(2), and the instance of AR 204 surrounded thereby. The instance of basic-MP contact 223 makes use of the space not occupied by the missing MG contact 208(2).

Stretched-MP contact 224P has a P-shape, i.e., a shape that resembles an upper case letter P. An uppercase letter P has a stem and an arm. In a default orientation for the uppercase letter P, the stem is parallel to the Y-axis, the arm is parallel to the X-axis; and the arm extends to a right side of the stem relative to the X-axis. The arm intersects a first end of the stem relative. The P-shape of MP contact 224P has a first orientation that is rotated about 90 degrees clockwise relative to the default orientation of the P-shape. Relative to an axis of symmetry of the P-shape that is parallel to the long axis of the stem of the P-shape in the default orientation of the P-shape, i.e., is parallel to the Y-axis, the first orientation of the P-shape of the stretched-MP contact 224L also is mirror-symmetric with respect to a P-shape having the default orientation.

The stem of the P-shape of stretched-MP contact 224P is coupled to MG contacts 208(3) and 208(4). The arm of the P-shape of stretched-MP contact 224P is coupled to MG contacts 208(1) and 208(3). In some embodiments, stretched-MP contact 224P is described as a hexagon. In some embodiments, stretched-MP contact 224P is described as a concave polygon.

In FIG. 2A, stretch-coupling region 232L includes: stretched-MP contact 224L; MG contacts 208(1) and 208(4) that surround corresponding instances of an AR 204; an instance of basic-MP contact 223; and an instance of MV contact 226 over the instance of basic-MP contact 223. As compared to stretch-coupling region 232I, stretch-coupling region 232L is missing MG contacts 208(2) and 208(3), and the instances of AR 204 surrounded thereby. The instance of basic-MP contact 223 makes use of the space not occupied by the missing MG contact 208(2).

In stretch-coupling region 232L, the pitch between instances of AR 204 that are correspondingly surrounded by MG contacts 208(1) and 208(4) is 1*P. In some embodiments, the pitch between instances of AR 204 that are correspondingly surrounded by MG contacts 208(1) and 208(4) is N*P.

Stretched-MP contact 224L has an L-shape, i.e., has a shape that resembles an upper case letter L. An uppercase letter L has a stem and an arm. In a default orientation of the uppercase letter L, the stem is parallel to the Y-axis, the arm is parallel to the X-axis, and the arm extends from a first end of and to a right side of the stem relative to the X-axis. In some embodiments, a silhouette of the arm of the L-shape of stretched-MP contact 224L is regarded as including the arm per se of stretched-MP contact 224L plus a borrowed portion 238(1) of MG contact 208(4). The L-shape of the MP contact 224L has a first orientation that is rotated about 90 degrees clockwise relative to the default orientation. Relative to an axis of symmetry parallel to the stem of the uppercase letter L in the default orientation thereof, the first orientation of stretched-MP contact 224L is mirror symmetric relative to the default orientation of the uppercase letter L.

The stem of the L-shape of stretched-MP contact 224L is coupled to MG contact 208(1). The arm of the L-shape of stretched-MP contact 224L is coupled to MG contact 208(4).

In FIG. 2A, stretch-coupling region 232Z includes: stretched-MP contact 224Z; MG contacts 208(1) and 208(4) that surround corresponding instances of an AR 204; two instances of basic-MP contact 223; and two instances of MV contact 226 over the corresponding instances of basic-MP contact 223. As compared to stretch-coupling region 232I, stretch-coupling region 232T is missing MG contacts 208(2) and 208(3), and the instances of AR 204 surrounded thereby. The instances of basic-MP contact 223 make use of the spaces not occupied correspondingly by the missing MG contacts 208(2) and 208(3).

In stretch-coupling region 232Z, the pitch between instances of AR 204 that are correspondingly surrounded by MG contacts 208(1) and 208(4) is 1*P. In some embodiments, the pitch between instances of AR 204 that are correspondingly surrounded by MG contacts 208(1) and 208(4) is N*P.

Stretched-MP contact 224Z has an Z-shape, i.e., a shape that resembles an upper case letter Z. An uppercase letter Z has a stem and first and second arms. In a default orientation of the Z-shape: the stem parallel to the Y-axis; the first and second arms are parallel to the X-axis; the first and second arms intersect corresponding first and second ends of the stem; and, relative to the third direction (X-axis), the first arm extends to a left side of the stem, and the second arm extends to a right side of the stem.

The Z-shape of MP contact 224Z has a first orientation that is rotated about 90 degrees counterclockwise relative to the default orientation the uppercase letter Z. The second arm of the Z-shape stretched-MP contact 224Z is coupled to MG contact 208(4). The first arm of the Z-shape stretched-MP contact 224Z is coupled to MG contact 208(1). In some embodiments, stretched-MP contact 224Z is described as an octagon. In some embodiments, stretched-MP contact 224P is described as a concave polygon.

In FIG. 2A, regarding stretch-coupling regions 232P, 232L and/or 232Z, in some embodiments, MV contact 226 is replaced correspondingly with a BPD contact (not shown).

In FIG. 2B, stretch-coupling region 232H includes: stretched-MP contact 224H; and MG contacts 208(1), 208(2), 208(3) and 208(4) that surround corresponding instances of an AR 204.

Stretched-MP contact 224H has an H-shape, i.e., a shape that resembles an upper case letter H. An uppercase letter H has first and second stems and a crossbar. In a default orientation of the H shape, the first and second stems are parallel to the Y-axis, the crossbar is parallel to the X-axis, and a central region of each of the first and second stems is intersected by the crossbar.

The H-shape of MP contact 224H has a first orientation that is the same as the default orientation of the uppercase letter H. The first stem of the H-shape of stretched-MP contact 224H is coupled to MG contacts 208(3) and 208(1). The second stem of the H-shape of stretched-MP contact 224H is coupled to MG contacts 208(4) and 208(2). In some embodiments, stretched-MP contact 224H is described as a dodecagon. In some embodiments, stretched-MP contact 224H is described as a concave polygon. The pitch relationships amongst MG contacts 208(1), 208(2), 208(3) and 208(4) in stretch-coupling region 232H are the same as in stretch-coupling region 232I.

In FIG. 2B, stretch-coupling region 232_4 includes: stretched-MP contact 224_4; MG contacts 208(1), 208(3) and 208(4) that surround corresponding instances of an AR 204; an instance of basic-MP contact 223; and an instance of MV contact 226 over the instance of basic-MP contact 223. As compared to stretch-coupling region 232I, stretch-coupling region 232T is missing MG contact 208(2), and the instance of AR 204 surrounded thereby. The instance of basic-MP contact 223 makes use of the space not occupied by the missing MG contact 208(2).

Stretched-MP contact 224_4 has an open-top 4-shape, i.e., a shape that resembles an open-top style of numeral 4, as contrasted with a closed-top style of numeral 4. The open-top style of numeral 4 has a stem, a crossbar and an ascender. In a default orientation of the open-top style of numeral 4: the stem and the ascender are parallel to the Y-axis; the crossbar is parallel to X-axis; a central region of the stem is intersected by a first end of the crossbar; and the ascender extends from a second end of the crossbar to an upper side of the crossbar relative to the Y-axis.

The 4-shape of stretched-MP contact 224_4 has a first orientation that, relative to an axis of symmetry parallel to the Y-axis, is mirror-symmetric with respect to the open-top style of numeral 4 having the default orientation. The stem of the 4-shape of stretched-MP contact 224_L is coupled to MG contacts 208(1) and 208(3). The ascender of the 4-shape of stretched-MP contact 224_L is coupled to MG contact 208(4). In some embodiments, stretched-MP contact 224_4 is described as a decagon. In some embodiments, stretched-MP contact 224_4 is described as a concave polygon. The pitch relationships amongst MG contacts 208(1), 208(3) and 208(4) in stretch-coupling region 232_4 are the same as in stretch-coupling region 232P.

In FIG. 2B, stretch-coupling region 232U includes: stretched-MP contact 224U; MG contacts 208(1), 208(3), 208(4) and 208(5) that surround corresponding instances of an AR 204; an instance of stretched-MP contact 224I which is labeled 224U(2) in stretch-coupling region 232U; a first instance of basic-MP contact 223 which is labeled 224U(1) in stretch-coupling region 232U; a second instance of basic-MP contact 223; and an instance of MV contact 226 over the instance of basic-MP contact 223. As compared to stretch-coupling region 232I, stretch-coupling region 232U is missing MG contact 208(2), and the instance of AR 204 surrounded thereby. The instance of basic-MP contact 223 makes use of the space not occupied by the missing MG contact 208(2).

The pitch relationships amongst MG contacts 208(1), 208(3) and 208(4) in stretch-coupling region 232U are the same as in stretch-coupling region 232P. In stretch-coupling region 232U, the pitch between instances of AR 204 that are correspondingly surrounded by MG contacts 208(1) and 208(5) is 2*P. In some embodiments, the pitch between instances of AR 204 that are correspondingly surrounded by MG contacts 208(1) and 208(5) is K*P, where K is a positive integer and 3≤K.

Stretched-MP contact 224U includes portions 224U(1), 224U(2) and 224U(3). Portion 224U(1) is an example of stretched-MP contact 224I that has been rotated about 90 degrees (90°) either clockwise or counterclockwise, and scaled to fit in gap 234 between MG contacts 208(1) and 208(3). Portion 224U(2) is an example of stretched-MP contact 224I that has been scaled to fit in gap 236 between MG contacts 208(3) and 208(4). Portion 224U(3) is an example of stretched-MP contact 224L, the latter having an L-shape. The L-shape of portion 224U(3) has a second orientation that is rotated about 180 degrees clockwise relative to the default orientation of the uppercase letter L. Relative to an axis of symmetry parallel to the stem of the uppercase letter L the default orientation thereof, the orientation of portion 224U(3) is mirror symmetric relative to the default orientation of the uppercase letter L.

A silhouette that includes borrowed portion 238(2) of MG contact 208(3), borrowed portion 238(3) of MG contact 208(4) and portions 224U(1)-224U(3) has a U-shape, i.e., has a shape that resembles an upper case letter U. Accordingly, stretched-MP contact 224U is described as having a U-shape, i.e., as having a shape that resembles an upper case letter U. An uppercase letter U has first and second stems and a crossbar. In a default orientation of the U shape, the first and second stems are parallel to the Y-axis, the crossbar is parallel to the X-axis, and a same end of each of the first and second stems is intersected by the crossbar.

Portion 224U(1) of stretched-MP contact 224U is coupled to MG contacts 208(1) and 208(3). Portion 224U(2) of stretched-MP contact 224U is coupled to MG contacts 208(3) and 208(4). Portion 224U(3) of stretched-MP contact 224U is coupled to MG contacts 208(4) and 208(5). In FIG. 2B, stretch-coupling region 232F includes: stretched-MP contact 224F; MG contacts 208(1), 208(3), 208(4), 208(5) and 208(6) that surround corresponding instances of an AR 204; an instance of stretched-MP contact 224I which is labeled 224F(2) in stretch-coupling region 232F; a first instance of basic-MP contact 223 which is labeled 224F(1) in stretch-coupling region 232F; a second instance of basic-MP contact 223; and an instance of MV contact 226 over the instance of basic-MP contact 223. As compared to stretch-coupling region 232I, stretch-coupling region 232F is missing MG contact 208(2), and the instance of AR 204 surrounded thereby. The instance of basic-MP contact 223 makes use of the space not occupied by the missing MG contact 208(2).

The pitch relationships amongst MG contacts 208(1), 208(3), 208(4) and 208(5) in stretch-coupling region 232F are the same as in stretch-coupling region 232U. In stretch-coupling region 232F, the pitch between instances of AR 204 that are correspondingly surrounded by MG contacts 208(4) and 208(6) is 2*P. In some embodiments, the pitch between instances of AR 204 that are correspondingly surrounded by MG contacts 208(4) and 208(6) is K*P, where K is a positive integer and 3≤K.

Stretched-MP contact 224F includes portions 224F(1), 224F(2) and 224F(3). Portion 224F(1) is similar to portion 224U(1), discussed above. Portion 224F(2) similar to portion 224U(2), discussed above. Portion 224F(3) is an example of stretched-MP contact 224T, the latter having T-shape. The T-shape of portion 224F(3) is rotated about 90 degrees clockwise relative to stretched-MP contact 224T, i.e., has the same orientation as the default orientation of the uppercase letter T.

A silhouette that includes borrowed portion 238(2) of MG contact 208(3), borrowed portion 238(3) of MG contact 208(4), borrowed portion 238(4) of MG contact 208(6) and portions 224F(1)-224F(3) has an F-shape, i.e., has a shape that resembles an upper case letter F. Accordingly, stretched-MP contact 224F is described as having an F-shape, i.e., as having a shape that resembles an upper case letter F. An uppercase letter U has first and second stems, a crossbar and an arm. In a default orientation of the U shape, the first and second stems are parallel to the Y-axis, the crossbar and arm are collinear with each other and parallel to the X-axis, a same first end of each of the first and second stems is intersected by the crossbar, and an end of the arm intersects the first end of the second stem.

Portion 224F(1) of stretched-MP contact 224F is coupled to MG contacts 208(1) and 208(3). Portion 224F(2) of stretched-MP contact 224F is coupled to MG contacts 208(3) and 208(4). Portion 224F(3) of stretched-MP contact 224F is coupled to MG contacts 208(4), 208(5) and 208(6).

In FIG. 2B, regarding stretch-coupling regions 232_4, 232U and/or 232F, in some embodiments, MV contact 226 is replaced correspondingly with a BPD contact (not shown).

In FIGS. 2A-2B, in some embodiments, various combinations of stretch-coupling regions 232I, 232T, 232P, 232L, 232Z, 232H, 232_4, 232U and/or 232F are made to facilitate coupling various instances of MG contacts (shown or not shown), MVcontacts (shown or not shown) and/or BPD contacts (shown).

FIGS. 3A-3H are layout diagrams of corresponding semiconductor devices that include one or more stretched-MP contacts, in accordance with some embodiments.

FIG. 3A is a layout diagram of an inverter 340A. Inverter 340A is an INVD2 type of inverter, where INVD2 is an acronym for an inverter (INV) having current-driving (alternatively, current-sourcing) strength of 2*D, where D is a unit of driving strength of the corresponding process node by which a device based on inverter 340A is manufactured. Inverter 340A includes an instance of stretched-MP contact 224H. Inverter 340A exhibits the M0VM1H architecture.

FIG. 3B is a layout diagram of an inverter 340B. Inverter 340B is an INVD2 type of inverter. Inverter 340B includes an instance of stretched-MP contact 224H. Inverter 340B exhibits the M0HM1V architecture.

FIGS. 3C-3H are layout diagrams of corresponding semiconductor devices that include one or more stretched-MP contacts, in accordance with some embodiments.

More particularly, FIGS. 3C-3H are layout diagrams of corresponding scan-D flip flops that have a single output (SDFQD1) 342C, 342D, 342E, 342F, 342G and 342H. SDFQD1 342C includes an instance of stretched-MP contact 224_4 and an instance of stretched-MP contact 224Z. SDFQD1 342D includes an instance of stretched-MP contact 224U. SDFQD1 342E includes instances of stretched-MP contact 224H. SDFQD1 342F includes instances of stretched-MP contact 224H and an instance of stretched-MP contact 224L. SDFQD1 342G includes instances of stretched-MP contact 224H, an instance of stretched-MP contact 224L, an instance of stretched-MP contact 224_4 and an instance of stretched-MP contact 224Z. SDFQD1 342H includes of stretched-MP contact 224H, an instance of stretched-MP contact 224U and an instance of stretched-MP contact 224L.

Figure 4:
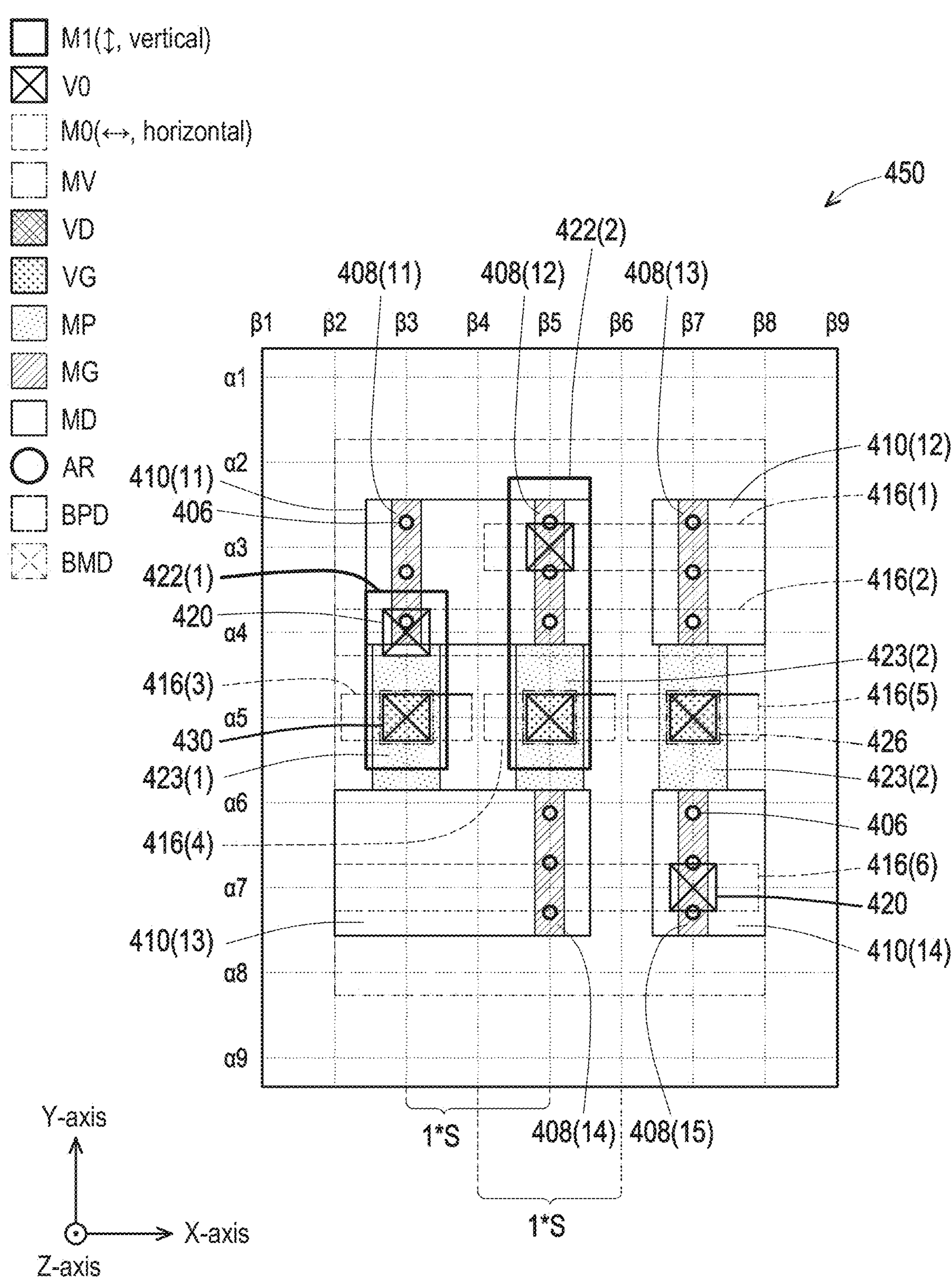
FIGS. 4 and 5A-5D are layout diagrams of corresponding semiconductor devices, in accordance with some embodiments.

FIG. 4 is layout diagram of corresponding region 450 of a semiconductor device, in accordance with some embodiments.

In FIG. 4, it is assumed that first, second and third orthogonal directions are, e.g., correspondingly parallel to the X-axis, Y-axis and Z-axis. Region 450 is a condensed region of the semiconductor device in terms of reducing otherwise wasted, i.e., unused space. Region 450 is condensed relative to the X-axis, e.g., in terms of including approximately 1 CPP sized M0 segments that are X-axis-adjacent M0, as discussed below. Region 450 is condensed relative to the Y-axis, e.g., in terms of adjacent-α-track spacing of VOs, as discussed below.

Region 450 includes: MD contacts 410(11), 410(12), 410(13) and 410(14); MG contacts 408(11, 408(12), 408(13), 408(14) and 408(15) that surround corresponding instances of an AR comprised of instances of nanowire 406; basic-MP contacts 423(1), 423(2) and 423(3); instances of an MV contact 426; instances of a VG contact 430; M0 segments 416(1), 416(2), 416(3), 416(4), 416(5) and 416(6); instances of a V0 contact 420; and M1 segments 422(1) and 422(2). In some each instance of the AR is comprised of one or more instances of a nanosheet.

Region 450 is arranged according to alpha tracks α1, α2, α3, α4, α5, α6, α7, α8 and α9 that extend in a direction parallel to the X-axis, and according to beta tracks β1, β2, β3, β4, β5, β6, β7, β8 and β9 that extend in a direction parallel to the Y-axis. The beta tracks have a pitch of 1*S, discussed below.

M0 segments 416(3), 416(4) and 416(5) have resulted from applying cuts to a longer precursor-M0 segment that are separated by a distance of 1*S relative to the X-axis, i.e., applying 1-S-separated cuts, where S is a where S represents a uniform distance between adjacent instances the AR (comprised of instances of nanowire 406 of AR 204) for the corresponding semiconductor process technology node. In some embodiments, the uniform distance S represents one contacted poly pitch (CPP) for the corresponding semiconductor process technology node. Here, the word 'poly' in the term CPP does not necessarily imply that the gate structures in semiconductor devices based correspondingly on FIG. 4 are to be formed of polysilicon but instead represents a historical convenience, i.e., because gate structures in ICs manufactured according to a predecessor semiconductor process technology node often were formed of polysilicon. Relative to the X-axis, each of M0 segments 416(3), 416(4) and 416(5) has a length $T \approx (1*S)$ albeit $T < (1*S)$. As such, relative to the X-axis, M0 segments 416(3), 416(4) and 416(5) together fit between beta tracks β2 and β8. Accordingly, region 450 is condensed relative to the X-axis.

Relative to the Y-axis, M1 segment 422(1) has a length a minimum length sufficient to accommodate: the instance of V0 contact 420 at the intersection of alpha track α4 and beta track β3, i.e., at intersection (α4, β3); and the instance of V0 contact 420 at the intersection of alpha track α5 and beta track β3, i.e., at intersection (α5, β3). Relative to the Y-axis, alpha tracks α4 and α5 are adjacent. The instances of V0 contact 420 at intersections (α4, β3) and (α5, β3) are alpha track adjacent. Accordingly, region 450 is condensed relative to the Y-axis, e.g., in terms of adjacent-α-track spacing of V0s.

FIGS. 5A-5D are layout diagrams of corresponding semiconductor devices that include one or instances of a condensed region, in accordance with some embodiments.

In FIGS. 5A-5D, it is assumed that first, second and third orthogonal directions are, e.g., correspondingly parallel to the X-axis, Y-axis and Z-axis. The condensed regions of FIGS. 5A-5D are similar to condensed region 450 of FIG. 4.

Figure 5A:
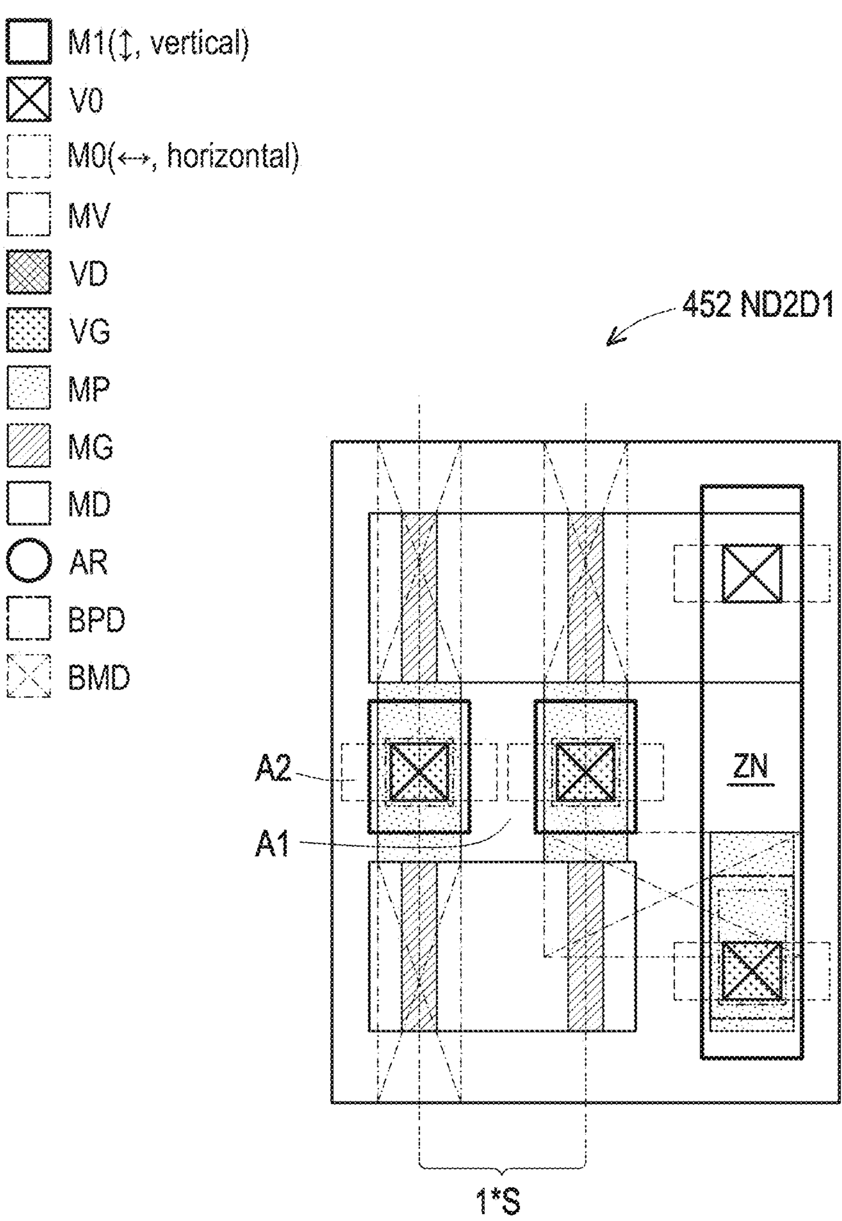
Figure 5A:
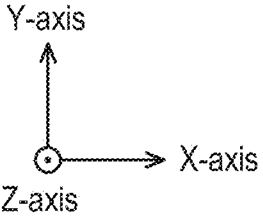

FIG. 5A is a layout diagram of a NAND gate 452. NAND gate 452 is an ND2D1 type of NAND gate, where ND2D1 is an acronym for a NAND gate having two inputs and a current-driving (alternatively, current-sourcing) strength of 1*D. Relative to the X-axis, each of the M0 segments has a length T≈(1*S) albeit T<(1*S). Two of the M0 segments are collinear and aligned to adjacent alpha tracks. Accordingly, NAND gate 452 is condensed relative to the X-axis.

Figure 5B:
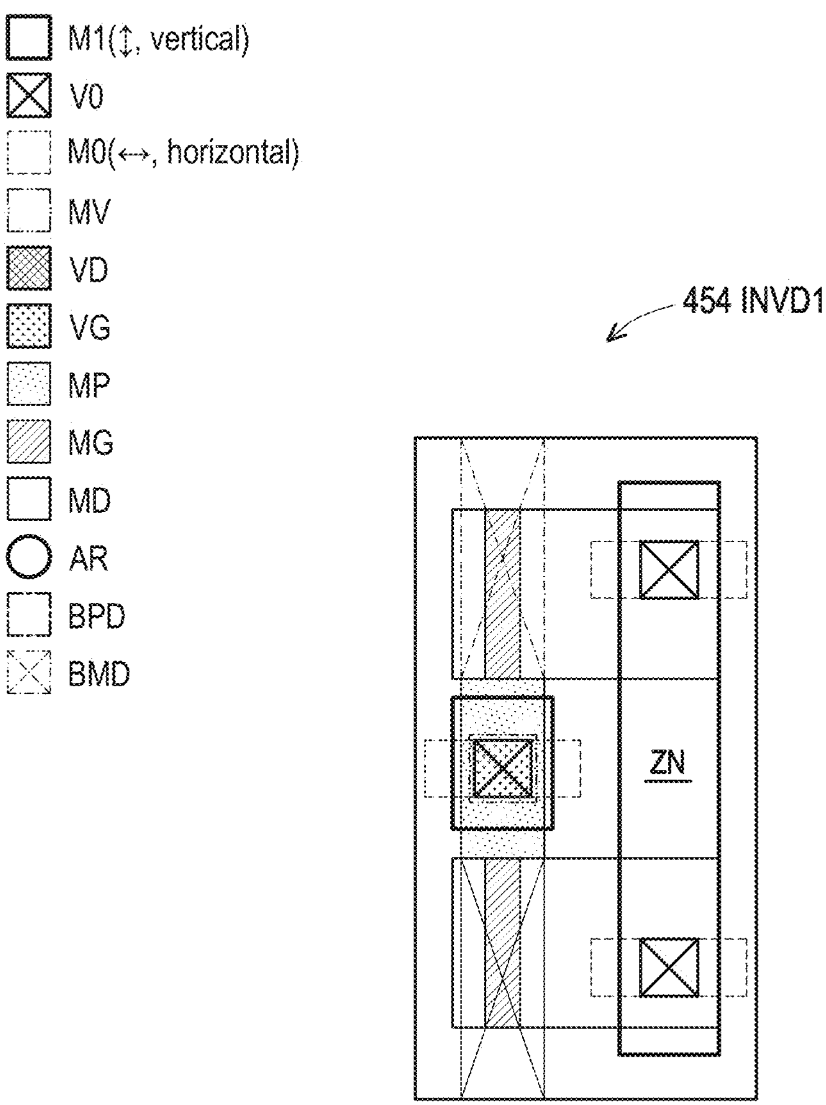
Figure 5B:
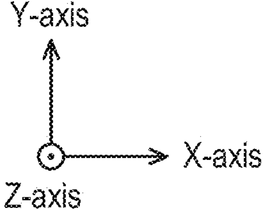

FIG. 5B is a layout diagram of an inverter 4454. Inverter 454 is an INVD1type of inverter, where INVD1 is an acronym for an inverter having a current-driving (alternatively, current-sourcing) strength of 1*D. Relative to the X-axis, each of the M0 segments has a length T≈(1*S) albeit T<(1*S). Accordingly, inverter 454 is condensed relative to the X-axis.

Figure 5C:
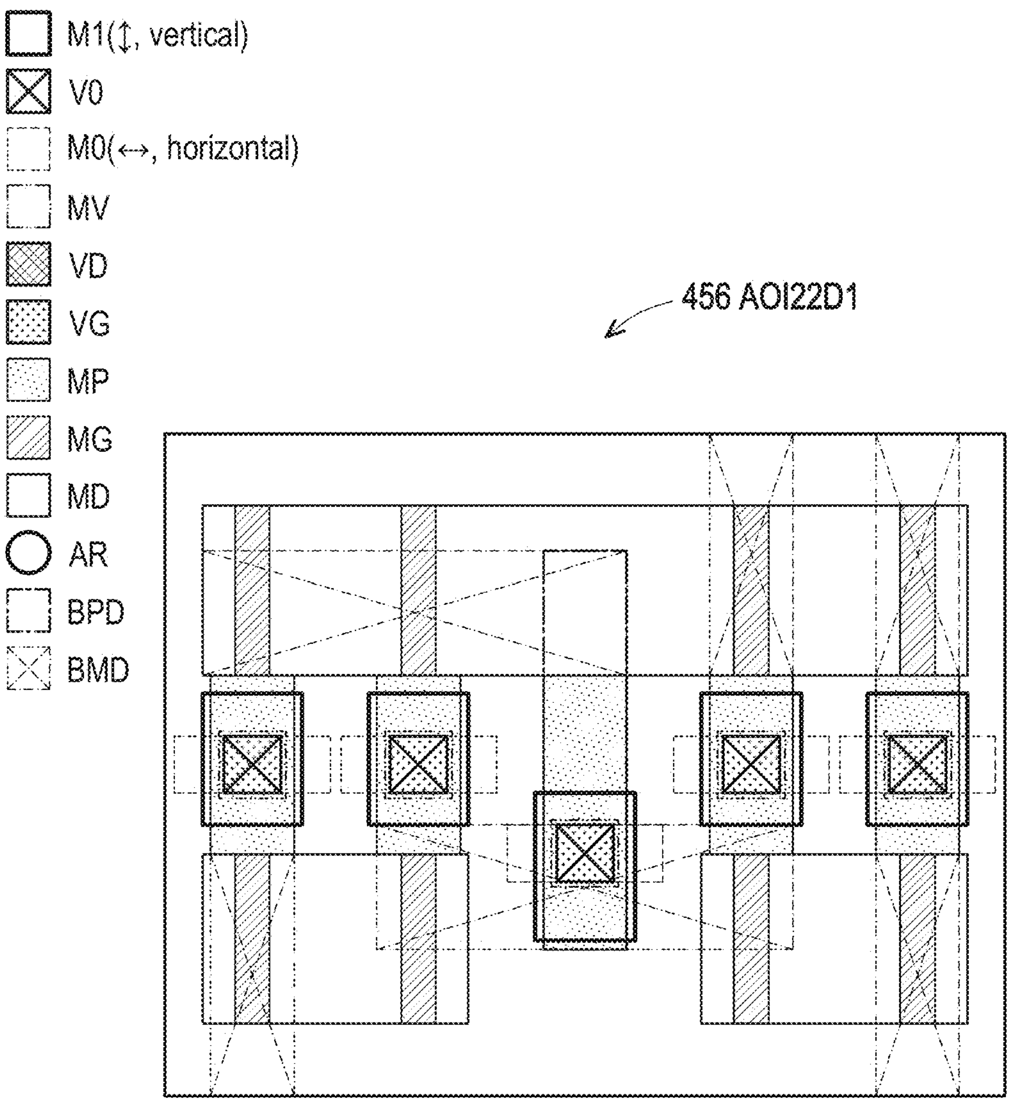
Figure 5C:
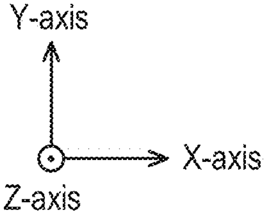

FIG. 5C is a layout diagram of an AND-OR-Invert (AOI) gate 456. AOI gate 456 is an AOI22D1 type of AOI gate, where AOI22D1 is an acronym for an AOI gate having two inputs and a current-driving (alternatively, current-sourcing) strength of 1*D. Relative to the X-axis, each of the M0 segments has a length T≈(1*S) albeit T<(1*S). Four of the M0 segments are collinear. Two pairs of the M0 segments are aligned correspondingly to adjacent alpha tracks. Accordingly, AOI gate 456 is condensed relative to the X-axis.

Figure 5D:
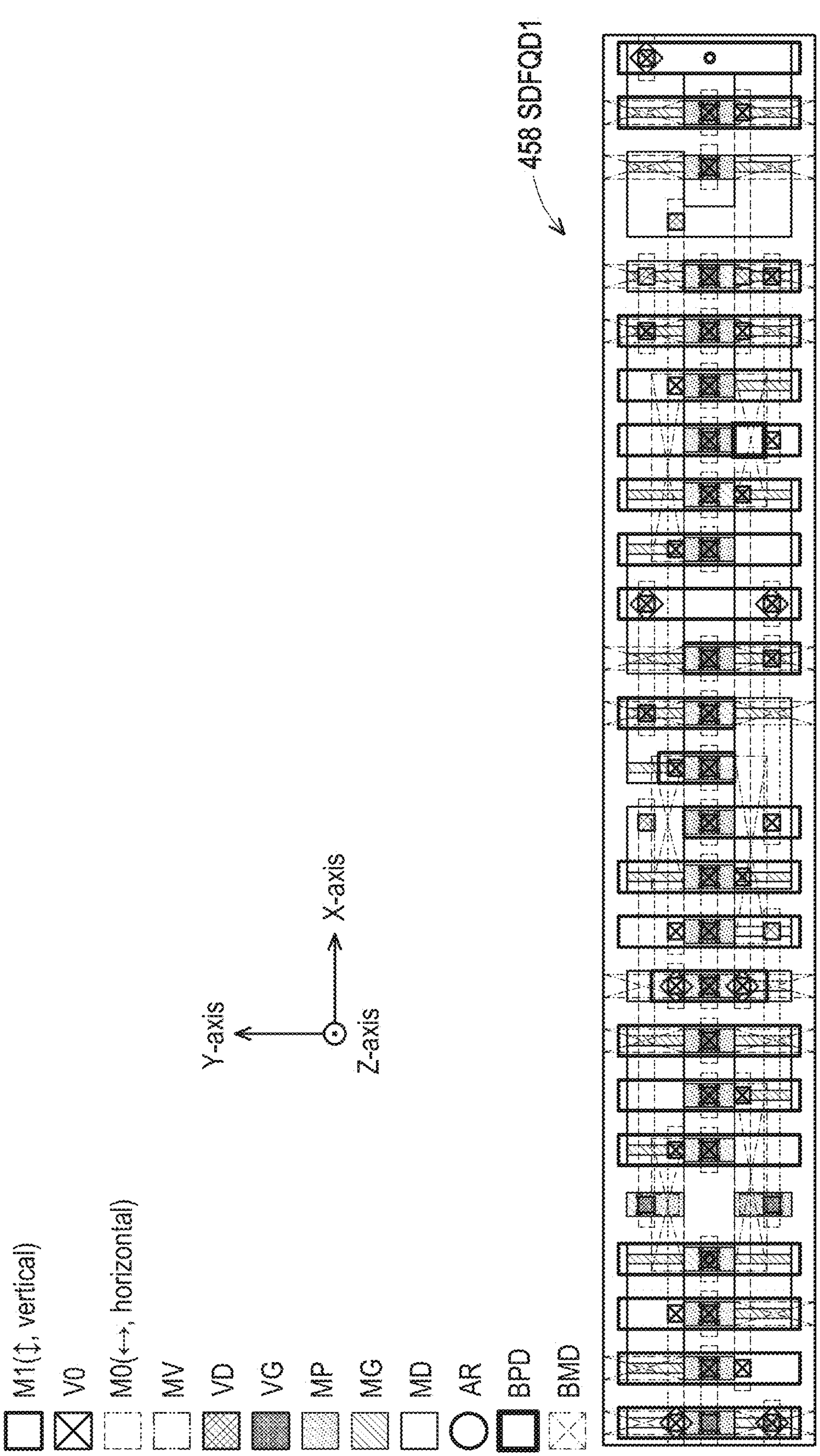

FIG. 5D is a layout diagram of an SDFQD1 458. Relative to the X-axis, 21 of the M0 segments have a length T≈(1*S) albeit T<(1*S), of which 19 are collinear. Thirteen pairs of the M0 segments are aligned correspondingly to adjacent alpha tracks. Accordingly, SDFQD1 458 is condensed relative to the X-axis.

Figure 6:
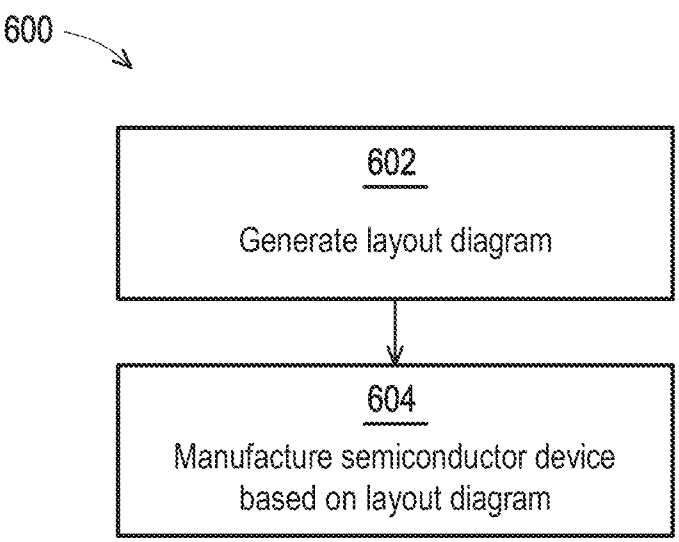
FIG. 6-7 are flowcharts of corresponding methods of manufacturing a memory device, in accordance with some embodiments.

FIG. 6 is a flowchart 600 of a method of manufacturing a memory device, in accordance with some embodiments.

The method of flowchart (flow diagram) 600 is implementable, for example, using EDA system 800 (FIG. 8, discussed below) and an IC manufacturing system 900 (FIG. 9, discussed below), in accordance with some embodiments. Examples of a semiconductor device which can be manufactured according to the method of flowchart 600 include the semiconductor devices of FIGS. 1A-1D, semiconductor devices based on layout diagrams disclosed herein, or the like.

In FIG. 6, the method of flowchart 600 includes blocks 602-604. At block 602, a layout diagram is generated which, among other things, includes one or more of layout diagrams disclosed herein, or the like. Block 602 is implementable, for example, using EDA system 800 (FIG. 8, discussed below), in accordance with some embodiments. From block 602, flow proceeds to block 604.

At block 604, based on the layout diagram, at least one of (A) one or more photolithographic exposures are made or (b) one or more semiconductor masks are fabricated or (C) one or more components in a layer of a semiconductor device are fabricated. See discussion below of IC manufacturing system 900 in FIG. 9 below.

Figure 7:
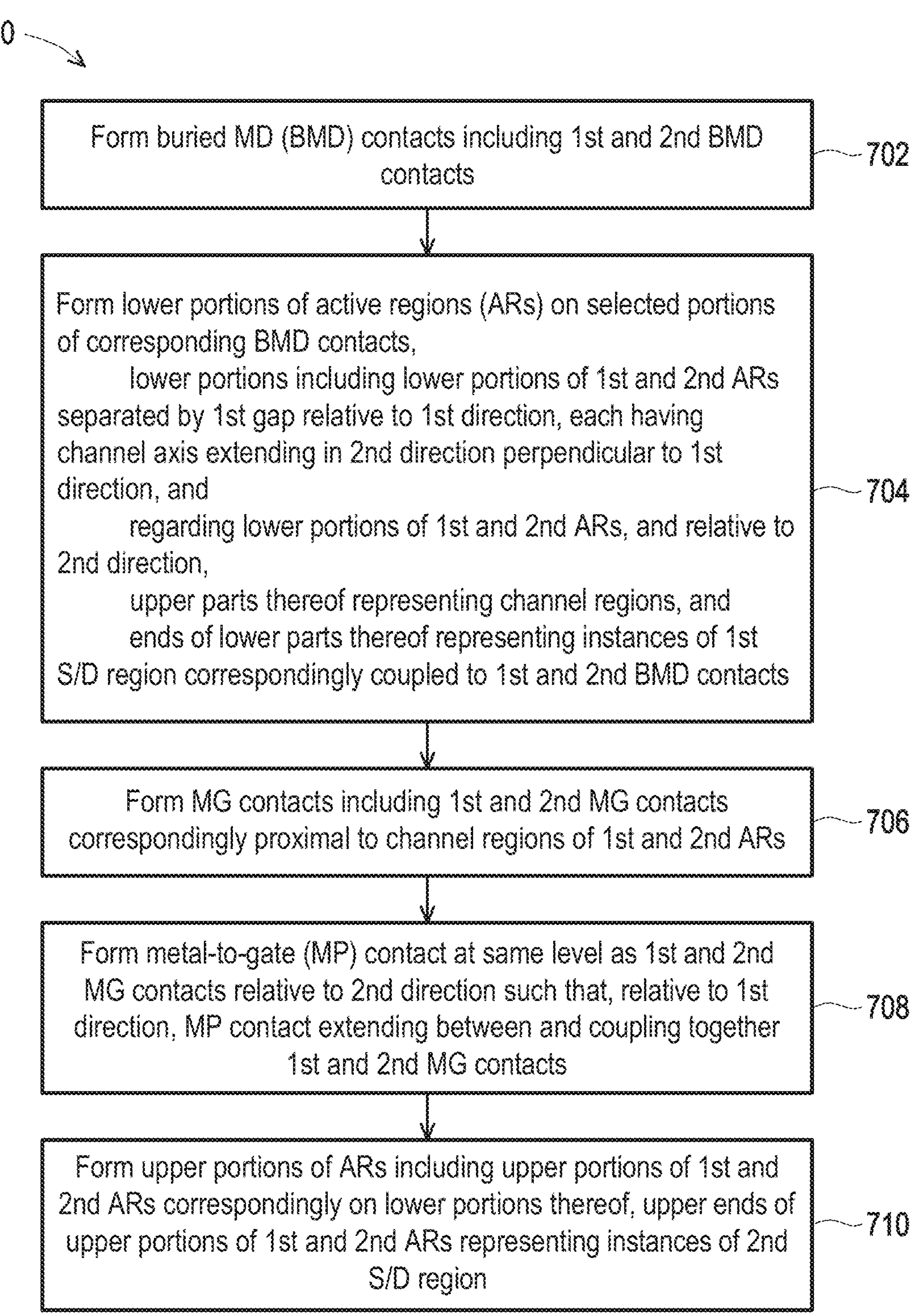

FIG. 7 is a flowchart 700 of a method of fabricating a semiconductor device, and more specifically a memory device, in accordance with some embodiments.

Flowchart 705 is an example of block 604 of FIG. 6. Flowchart 700 includes blocks 702-710. Examples provided in the context of the discussion of blocks 702-710 assume first, second and third orthogonal directions that are, e.g., correspondingly parallel to the X-axis, Y-axis and Z-axis. The method of flowchart 700 is implementable, for example, using IC manufacturing system 900 (FIG. 9, discussed below), in accordance with some embodiments. Examples of a semiconductor device which can be manufactured according to the method of flowchart 700 include the semiconductor devices of FIGS. 1A-1D, semiconductor devices based on layout diagrams disclosed herein, or the like.

In FIG. 7, at block 702, buried MD (BMD) contacts including first and second buried MD BMD contacts are formed. Examples of the instances of BMD contact include BMD contact 112 corresponding to MG contacts 108(3) and 108(1), or the like. From block 702, flow proceeds to block 704.

At block 704, lower portions of active regions (ARs) are formed on selected portions of corresponding BMD contacts, the lower portions including lower portions of first and second ARs.

Regarding the lower portions of the first and second ARs, and relative to the Z-axis, upper parts thereof represent channel regions, and ends of lower parts thereof represent instances of a first source/drain (S/D) region correspondingly coupled to the first and second BMD contacts. Examples of the lower portions of the first and second ARs include the lower portions of the instances of AR 104 surrounded correspondingly by MG contacts 108(3) and 108(1) which are separated relative to the Y-axis, each such AR having a channel axis extending parallel to the Z-axis, or the like. From block 704, flow proceeds to block 706.

At block 706, metal-to-gate (MG) contacts are formed correspondingly proximal to the channel regions of the first and second ARs, the MG contacts including first and second MG contacts. Examples of the first and second MG contacts include MG contacts 108(3) and 108(1), or the like. From block 7-6, flow proceeds to block 708.

At block 708, a metal-to-gate (MP) contact is formed at a same level as the first and second MG contacts relative to the Z-axis, the MP contact extending between the first and second MG contacts relative to the Y-axis, and the MP contact coupling together the first and second MG contacts. An example of the MP contact is stretched-MP contact 124, or the like. From block 708, flow proceeds to block 710.

At block 710, upper portions of the ARs are formed correspondingly on the lower portions thereof, the upper portions including upper portions of the first and second ARs. Upper ends of the upper portions of the ARs represent instances of a second S/D region. Examples of the upper portions of the ARs including the upper portions of the instances of AR 104 surrounded correspondingly by MG contacts 108(3) and 108(1).

Figure 8:
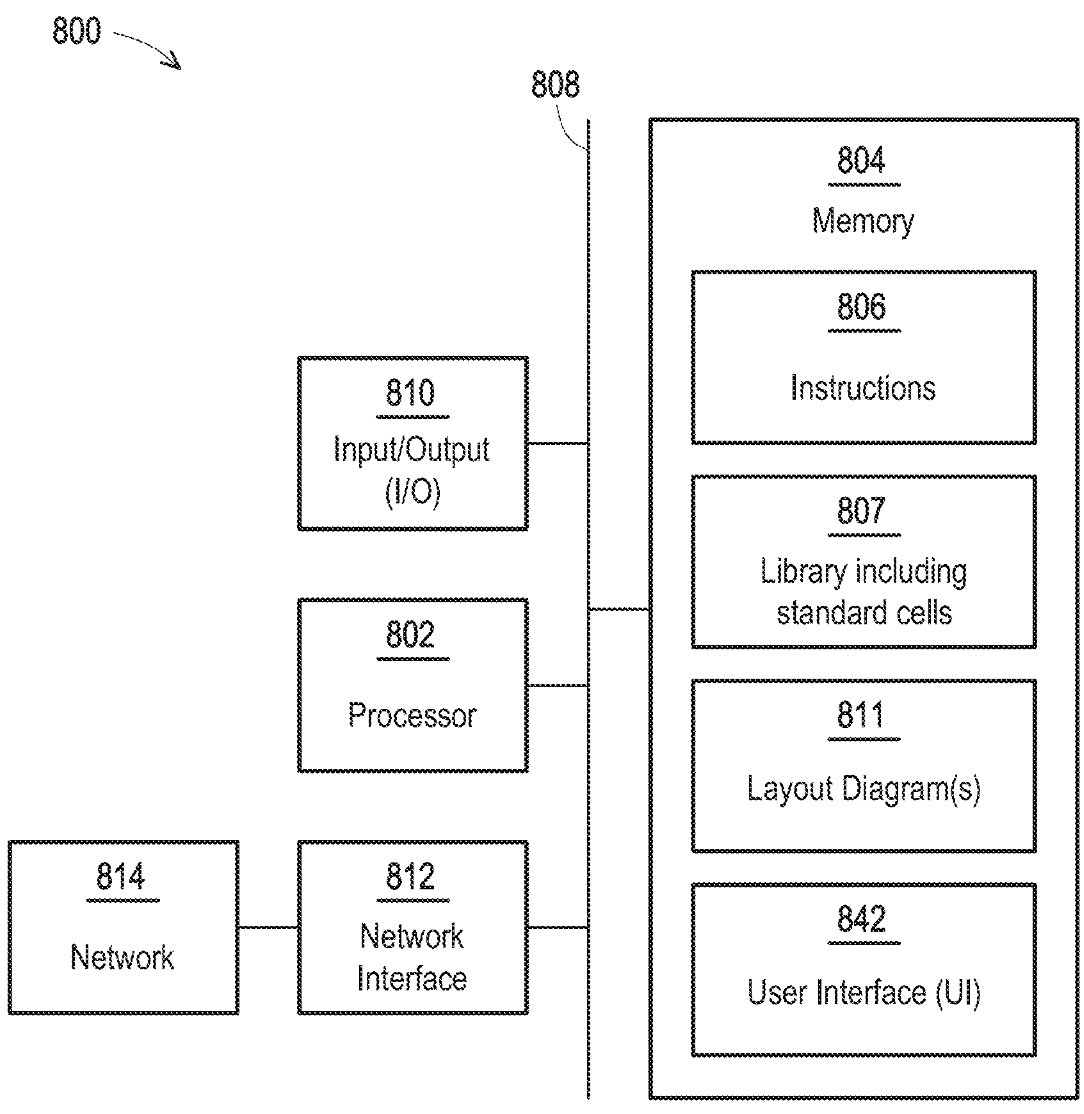
FIG. 8 is a block diagram of an electronic design automation (EDA) system in accordance with some embodiments.

FIG. 8 is a block diagram of an electronic design automation (EDA) system 800 in accordance with some embodiments.

In some embodiments, EDA system 800 includes an automatic placement and routing (APR) system. In some embodiments, EDA system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of, e.g., the method of FIG. 5 (block 502), methods of generating layout diagrams such as FIGS. 2B-2R, methods of generating layout diagrams corresponding to block diagrams such as FIG. 1A-1H, or the like, in accordance with one or more embodiments (hereinafter, the noted processes and/or methods). Storage medium 804, amongst other things, stores layout diagrams 811 such as the layout diagrams disclosed herein, other the like.

Processor 802 is electrically coupled to computer-readable storage medium 804 via a bus 808. Processor 802 is further electrically coupled to an I/O interface 810 by a bus 808. A network interface 812 is further electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause system 800 (where such execution represents (at least in part) the EDA tool) to be usable for performing a portion or all of the noted processes and/or methods. In one or more embodiments, storage medium 804 further stores information which facilitates performing a portion or all of the noted processes and/or methods. In one or more embodiments, storage medium 804 stores library 807 of standard cells including such standard cells as disclosed herein. In some embodiments, storage medium 804 stores one or more layout diagrams 811.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 further includes network interface 812 coupled to processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 800.

System 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a user interface (UI) through I/O interface 810. The information is stored in computer-readable medium 804 as UI 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
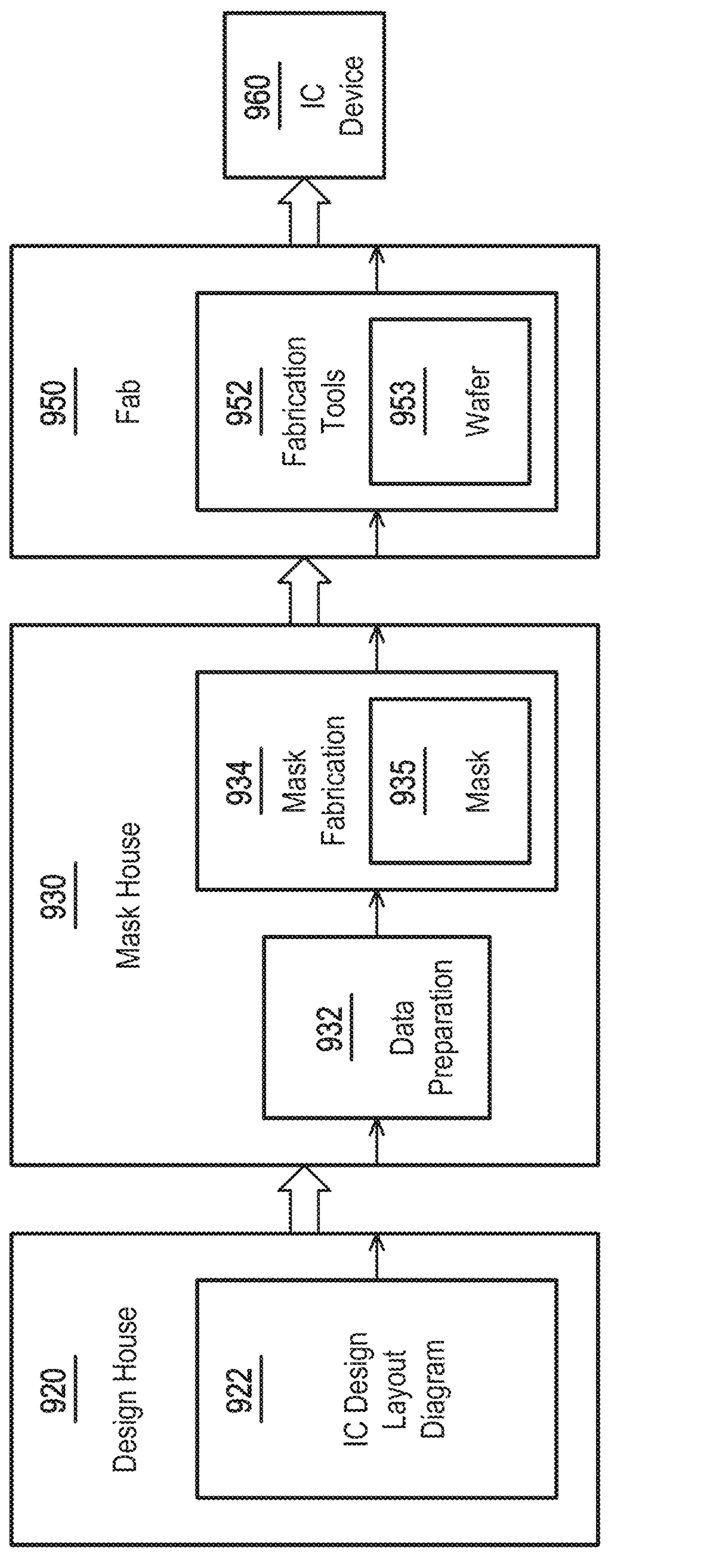
FIG. 9 is a block diagram of an integrated circuit (IC) manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with some embodiments.

Based on the layout diagram generated by block 502 of FIG. 5, the IC manufacturing system 900 implements block 504 of FIG. 5 wherein at least one of (A) one or more semiconductor masks or (B) at least one component in a layer of an inchoate semiconductor integrated circuit is fabricated using manufacturing system 900.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Source/drain region(s) may refer to a source or a drain, individually or collectively, dependent upon the context. Design house 920 implements a proper design procedure to form IC design layout 922. The design procedure includes one or more of logic design, physical design or place and route. IC design layout 922 is presented in one or more data files having information of the geometrical patterns. For example, IC design layout 922 is expressed in a GDSII file format or DFII file format.

Mask house 930 includes data preparation 932 and mask fabrication 934. Mask house 930 uses IC design layout 922 to manufacture one or more masks 935 to be used for fabricating the various layers of IC device 960 according to IC design layout 922. Mask house 930 performs mask data preparation 932, where IC design layout 922 is translated into a representative data file ("RDF"). Mask data preparation 932 supplies the RDF to mask fabrication 934. Mask fabrication 934 includes a mask writer. A mask writer converts the RDF to an image on a substrate, such as a mask (reticle) or a semiconductor wafer. The design layout is manipulated by mask data preparation 932 to comply with particular characteristics of the mask writer and/or requirements of IC fab 950. In FIG. 9, mask data preparation 932, mask fabrication 934, and mask 935 are illustrated as separate elements. In some embodiments, mask data preparation 932 and mask fabrication 934 are collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 932 includes further resolution enhancement techniques (RET), such as off-axis illumination, sub-resolution adjust features, phase-shifting masks, other suitable techniques, and the like or combinations thereof. In some embodiments, inverse lithography technology (ILT) is further used, which treats OPC as an inverse imaging problem.

In some embodiments, mask data preparation 932 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 934, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout 922 to fabricate a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 922.

The above description of mask data preparation 932 has been simplified for the purposes of clarity. In some embodiments, mask data preparation 932 includes additional features such as a logic operation (LOP) to modify the IC design layout according to manufacturing rules. Additionally, the processes applied to IC design layout 922 during data preparation 932 may be executed in a variety of different orders.

After mask data preparation 932 and during mask fabrication 934, a mask 935 or a group of masks 935 are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 950 is an IC fabrication business that includes one or more manufacturing facilities for the fabrication of a variety of different IC products. In some embodiments, IC fab 950 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 950 uses mask (or masks) 935 fabricated by mask house 930 to fabricate IC device 960 using fabrication tools 952. Thus, IC fab 950 at least indirectly uses IC design layout 922 to fabricate IC device 960. In some embodiments, a semiconductor wafer 953 is fabricated by IC fab 950 using mask (or masks) 935 to form IC device 960. Semiconductor wafer 953 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, a semiconductor device (having a vertical field-effect transistor (VFET) architecture) includes:

active regions (ARs) including first and second ARs separated relative to a first direction, each having a channel axis extending in a second direction perpendicular to the first direction, and each having a channel region between selected portions of overlying first and underlying second source/drain (S/D) regions relative to the second direction; metal-to-gate (MG) contacts including first and second MG contacts correspondingly proximal to the channel regions of the first and second ARs and separated relative to a first direction; relative to the second direction, metal-to-source/drain (MD) contacts and buried MD (BMD) contacts correspondingly coupled to the first and second S/D regions correspondingly of the first and second ARs; and a metal-to-gate (MP) contact at a same level as the MG contacts relative to the second direction, and extending between and coupling together the first and second MG contacts relative to the first direction; relative to a third direction perpendicular to each of first and second directions, the first and second ARs being substantially aligned; and at least a portion of the MP contact extending substantially beyond each of the first and second ARs relative to the third direction.

In some embodiments, the ARs further include a third AR having a channel axis extending in the second direction, and having a channel region between overlying first and underlying second source/drain (S/D) regions relative to the second direction; and the third AR is separated from the first AR relative to the third direction; and relative to the third direction, the at least a portion of the MP contact at least partially overlaps the third AR.

In some embodiments, relative to a reference plane defined by the first direction and a third direction perpendicular to each of first and second directions, a shape of the MP contact is an irregular polygon.

In some embodiments, relative to a reference plane defined by the first direction and a third direction perpendicular to each of first and second directions, a shape of the MP contact is a concave polygon.

In some embodiments, the shape of the MP contact is a convex polygon.

In some embodiments, relative to a reference plane defined by first and third directions, a shape of the MP contact is a polygon having N sides, where N is an even integer and 4≤N.

In some embodiments, N=4 such that the shape of the MP contact is a rectangle.

In some embodiments, N=6 such that the shape of the MP contact is a hexagon.

In some embodiments, the shape of the MP contact is an L-shape.

In some embodiments, the L-shape has a stem and an arm for which a default orientation of the L-shape has the stem parallel to the first direction, the arm parallel to a third direction perpendicular to each of first and second directions, and the arm extending to a right side of the stem relative to the third direction; regarding a first end of the stem of the L-shape relative to the first direction, the arm intersects the first end of the stem relative to the first direction; and the L-shape of the MP contact has a first or second orientation; the first orientation of the L-shape of the MP contact is rotated about 90 degrees clockwise relative to the default orientation; and relative to an axis of symmetry of the L-shape of the MP contact that is parallel to the third direction in the default orientation, the second orientation of the L-shape of the MP contact is mirror-symmetric with respect to an L-shape having the default orientation.

In some embodiments, the first AR is separated from the second AR relative to the third direction; the first and second MG contacts are separated relative to the third direction; the stem of the L-shape of the MP contact is coupled to the second MG contact; and the arm of the L-shape of the MP contact is coupled to the third MG contact.

In some embodiments, the shape of the MP contact is a P-shape.

In some embodiments, the P-shape has a stem and an arm for which a default orientation of the P-shape has the stem parallel to the first direction, the arm parallel to a third direction perpendicular to each of first and second directions, and the arm extending to a right side of the stem relative to the third direction; regarding a first end of the stem of the L-shape relative to the first direction, the arm intersects the first end of the stem relative to the first direction; and the P-shape of the MP contact has a first orientation; the first orientation of the P-shape of the MP contact is: rotated about 90 degrees clockwise relative to the default orientation of the P-shape, and relative to an axis of symmetry of the P-shape that is parallel to the first direction in the default orientation of the P-shape, the first orientation of the P-shape of the MP contact is mirror-symmetric with respect to a P-shape having the default orientation.

In some embodiments, the ARs further include a third AR having a channel axis extending in the second direction, and having a channel region between overlying first and underlying second source/drain (S/D) regions relative to the second direction; the third AR is separated from the first AR relative to the third direction; the MG contacts further include a third MG contact proximal to the channel region of the third AR; the first and second MG contacts are substantially aligned relative to the first direction; the third and first MG contacts are separated relative to the third direction; the stem of the P-shape of the MP contact is coupled to the first and third MG contacts; and the arm of the P-shape of the MP contact is coupled to the first and second MP contacts.

In some embodiments, N=8 such that the shape of the MP contact is an octagon.

In some embodiments, the shape of the MP contact is a T-shape or a Z-shape.

In some embodiments, the T-shape has a stem and an arm for which a default orientation of the T shape has the stem parallel to the first direction and the arm parallel to a third direction perpendicular to each of first and second directions, a central region of the arm being intersected by the stem; regarding a first end of the stem relative to the first direction, the arm intersects the first end of the stem; the T-shape of the MP contact has a first orientation; and the first orientation of the T-shape of the MP contact is rotated about 90 degrees counterclockwise relative to the default orientation of the T-shape.

In some embodiments, the arm of the T-shape is coupled to the first and second MG contacts; and the stem of the T-shape extends substantially beyond each of the first and second MG contacts relative to the third direction. In some embodiments, the Z-shape has a stem and first and second arms for which a default orientation of the Z-shape has the stem parallel to the first direction, the first and second arms parallel to a third direction perpendicular to each of first and second directions, the first and second arms intersecting corresponding first and second ends of the stem, and, relative to the third direction, the first arm extending to a left side of the stem, and the second arm extending to a right side of the stem; the Z-shape of the MP contact has a first orientation; and the first orientation of the Z-shape of the MP contact is rotated about 90 degrees counterclockwise relative to the default orientation.

In some embodiments, relative to the third direction: the second MG contact is separated from the first MG contact relative to the third direction; the second arm is coupled to the first MG contact; and the first arm is coupled to the second MG contact.

In some embodiments, N=12 such that the shape of the MP contact is a dodecagon.

In some embodiments, the shape of the MP contact is an H-shape or a 4-shape.

In some embodiments, the H-shape has first and second stems and a crossbar for which a default orientation of the H shape has the first and second stems parallel to the first direction, the crossbar being parallel to a third direction perpendicular to each of first and second directions, and a central region of each of the first and second stems being intersected by the crossbar; the H-shape of the MP contact has a first orientation; and the first orientation of the H-shape of the MP contact is the default orientation of the H-shape.

In some embodiments, the ARs further include third and fourth ARs separated relative to the third direction, each having a channel axis extending in the second direction, and each having a channel region between overlying first and underlying S/D regions relative to the second direction; the MG contacts further include third and fourth MG contacts proximal to the channel region of the third and fourth ARs; the third and fourth MG contacts are separated correspondingly from the first and second MG contacts; the first stem of the H-shape of the MP contact is coupled to first and second MG contacts; and the second stem of the H-shape of the MP contact is coupled to third and fourth MG contacts.

In some embodiments, the 4-shape has a stem, a crossbar and an ascender for which a default orientation of the 4 shape has the stem and the ascender parallel to the first direction, the crossbar being parallel to a third direction perpendicular to each of first and second directions, a central region of the stem being intersected by a first end of the crossbar, and the ascender extending from a second end of the crossbar to an upper side of the crossbar relative to the first direction; and the 4-shape of the MP contact has a first orientation; and relative to an axis of symmetry parallel to the first direction, the first orientation of the 4-shape of the MP contact is mirror-symmetric with respect to a 4-shape having the default orientation.

In some embodiments, the ARs further include a third AR having a channel axis extending in the second direction, and having a channel region between overlying first and underlying second source/drain (S/D) regions relative to the second direction; and the MG contacts further include a third MG contact proximal to the channel region of the third AR; the first and second MG contacts are substantially aligned relative to the third direction; the third MG contact is separated from the first MG contact relative to the third direction; the first and third MG contacts are substantially aligned relative to the first direction; the stem of the 4-shape of the MP contact is coupled to the first and second MG contacts; and the ascender of the 4-shape of the MP contact is coupled to the third MG contact.

In some embodiments, each of the first and second ARs is comprised of corresponding nanowires.

In some embodiments, a method (of forming a semiconductor device having a vertical field-effect transistor (VFET) architecture) includes: forming buried metal-to-source/drain (MD) contacts including first and second buried MD (BMD) contacts; forming lower portions of active regions (ARs) on selected portions of corresponding BMD contacts, the lower portions including lower portions of first and second ARs separated relative to a first direction, each having a channel axis extending in a second direction perpendicular to the first direction; regarding the lower portions of the first and second ARs, and relative to the second direction, upper parts thereof representing channel regions, and ends of lower parts thereof representing instances of a first source/drain (S/D) region correspondingly coupled to the first and second BMD contacts; forming metal-to-gate (MG) contacts including first and second MG contacts correspondingly proximal to the channel regions of the first and second ARs and separated relative to a first direction; forming a metal-to-gate (MP) contact at a same level as the first and second MG contacts relative to the second direction such that, relative to the first direction, the MP contact extending between and coupling together the first and second MG contacts; forming upper portions of ARs including upper portions of the first and second ARs correspondingly on the lower portions thereof, upper ends of the upper portions of the first and second ARs representing instances of a second S/D region; and forming metal-to-source/drain (MD) contacts including first and second MD contacts correspondingly on and coupled to the instances of the second S/D region correspondingly of the first and second ARs; the forming buried metal-to-source/drain (MD) contacts including: substantially aligning selected portions of the first and second BMD contacts relative to a third direction perpendicular to each of first and second directions; the forming lower portions including: relative to the third direction, substantially aligning the first and second ARs correspondingly with the selected portions of the first and second BMD contacts; and the forming a metal-to-gate (MP) contact including: regarding at least a portion of the MP contact relative to the first direction, extending the at least a portion of the MP contact substantially beyond each of the first and second ARs relative to the third direction.

In some embodiments, the BMD contacts further include a third BMD contact; the lower portions of the ARs further include lower portions of a third AR having a channel axis extending in the second direction, an upper part thereof representing a channel region, and an end of a lower part thereof representing an instance of the first S/D region; the forming lower portions includes: locating the lower portion of the third AR over a selected portion of the third BMD contact; and relative to the third direction, separating the third and first BMD contacts; the MG contacts further include a third MG contact proximal to the channel region of the third AR; the forming a metal-to-gate (MP) contact includes: relative to the third direction, extending the at least a portion of the MP contact to at least partially overlap the third AR; the upper portions of the ARs further include an upper portion of the third AR correspondingly on the lower portion thereof, an upper end of the upper portion of the third ARs representing an instance of the second S/D region; and the MD contacts further include a third MD contact on and coupled to the instance of the second S/D region of the third AR.

In some embodiments, the forming a metal-to-gate (MP) contact includes: relative to a reference plane defined by the first direction and a third direction perpendicular to each of first and second directions, constructing a shape of the MP contact to be an irregular polygon.

In some embodiments, the forming a metal-to-gate (MP) contact includes: relative to a reference plane defined by the first direction and a third direction perpendicular to each of first and second directions, constructing a shape of the MP contact to be a concave polygon.

In some embodiments, the shape of the MP contact is a concave polygon.

In some embodiments, the forming a metal-to-gate (MP) contact includes: relative to a reference plane defined by first and third directions, constructing a shape of the MP contact to be a polygon having N sides, where N is an even integer and 4≤N.

In some embodiments, the forming lower portions includes constructing the lower portions to include lower portions of corresponding nanowires; and the forming upper portions includes constructing the upper portions to include upper portions of corresponding nanowires.

In some embodiments, a semiconductor device includes: active regions (ARs) including first, second and third ARs each having a channel axis extending in a first direction, and each having a channel region between selected portions of overlying first and underlying second source/drain (S/D) regions relative to the first direction, each of the ARs having a width axis extending in a second direction perpendicular to the first direction, and a thickness axis extending in a third direction perpendicular to the first and second directions, and the width axes of the ARs being aligned to corresponding beta reference tracks (beta tracks) extending parallel to the second direction such that the first AR being aligned to a first beta track and each of the second and third ARs being aligned to a second beta track; metal-to-gate (MG) contacts including first, second and second MG contacts correspondingly proximal to the channel regions of the first, second and third ARs; metal-to-source/drain (MD) contacts including first and second MD contacts over and correspondingly coupled to the first S/D regions of the first and second ARs; buried MD (BMD) contacts including first and second buried BMD contacts under and correspondingly coupled to the second S/D regions of the first and second ARs; metal-to-gate (MP) contacts at a same level as the MG contacts relative to the second direction, the MP contacts including first and second metal-to-gate (MP) contacts extending between and coupling together the first and second MG contacts relative to the first direction; M_1st segments in an M_1st layer of metallization having long axes extending in the third direction and aligned correspondingly to alpha reference tracks (alpha tracks) extending in the third direction, the M_1st segments including first and second M_1st segments correspondingly aligned to adjacent first and second alpha tracks; and via-to-M_1st (V_1st) contacts including first and second V_1st contacts over the first and second M_1st segments, aligned correspondingly to the first and second alpha tracks and to a first one of the beta tracks (first beta track).

In some embodiments, the ARs further include fourth and fifth ARs, each of the fourth and fifth ARs being aligned to a third beta track; the MG contacts further include fourth and fifth MG contacts correspondingly proximal to the channel regions of the fourth and fifth ARs; the MD contacts further include third and fourth MD contacts over and correspondingly coupled to the first S/D regions of the fourth and fifth ARs; buried MD (BMD) contacts including third and fourth buried BMD contacts under and correspondingly coupled to the second S/D regions of the fourth and fifth ARs; the MP contacts further include a third MP contact extending between and coupling together the fourth and fifth MG contacts relative to the first direction; the M_1st segments including a third and fourth M_1st segments correspondingly aligned to the second alpha track; each of the third and fourth M_1st segments is free from being intersected by any of the beta tracks other than correspondingly second and third ones of the beta tracks (second and third beta tracks); and the V_1st contacts further include third and fourth V_1st contacts over the third and fourth M_1st segments, aligned to the second alpha track and correspondingly to the second and third beta tracks.

In some embodiments, the first M_1st segment is intersected by the first beta track and at least another one of the beta tracks; and the second M_1st segment is free from being intersected by any of the beta tracks other than the first beta track.

In some embodiments, each of the first, second and third ARs is comprised of corresponding nanowires.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device having a vertical field-effect transistor (VFET) architecture, the device comprising:

active regions (ARs) including first and second ARs separated relative to a first direction, each having a channel axis extending in a second direction perpendicular to the first direction, and each having a channel region between selected portions of overlying first and underlying second source/drain (S/D) regions relative to the second direction;

metal-to-gate (MG) contacts including first and second MG contacts correspondingly proximal to the channel regions of the first and second ARs and separated relative to the first direction;

relative to the second direction, metal-to-source/drain (MD) contacts and buried MD (BMD) contacts correspondingly coupled to the first and second S/D regions correspondingly of the first and second ARs; and a metal-to-gate (MP) contact at a same level as the MG contacts relative to the second direction, and extending between and coupling together the first and second MG contacts relative to the first direction; and relative to a third direction perpendicular to each of first and second directions, the first and second ARs being substantially aligned; and at least a portion of the MP contact extending substantially beyond each of the first and second ARs relative to the third direction.

2. The device of claim 1, wherein:

the ARs further include a third AR having a channel axis extending in the second direction, and having a channel region between overlying first and underlying second source/drain (S/D) regions relative to the second direction; and the third AR is separated from the first AR relative to the third direction; and relative to the third direction, the at least a portion of the MP contact at least partially overlaps the third AR.

3. The device of claim 1, wherein:

relative to a reference plane defined by the first direction and a third direction perpendicular to each of first and second directions, a shape of the MP contact is an irregular polygon.

4. The device of claim 1, wherein:

relative to a reference plane defined by the first direction and a third direction perpendicular to each of first and second directions, a shape of the MP contact is a concave polygon.

5. The device of claim 1, wherein:
a shape of the MP contact is a convex polygon.

6. The device of claim 1, wherein:
relative to a reference plane defined by first and third directions, a shape of the MP contact is a polygon having N sides, where N is an even integer and 4≤N.

7. The device of claim 6, wherein:
N=4 such that the shape of the MP contact is a rectangle.

8. The device of claim 6, wherein:
N=6 such that the shape of the MP contact is a hexagon.

9. The device of claim 6, wherein:
N=8 such that the shape of the MP contact is an octagon.

10. The device of claim 6, wherein:
N=12 such that the shape of the MP contact is a dodecagon.

11. The device of claim 1, wherein:
each of the first and second ARs is comprised of corresponding nanowires.

12. A method of forming a semiconductor device having a vertical field-effect transistor (VFET) architecture, the method comprising:
forming buried metal-to-source/drain (MD) contacts including first and second buried MD (BMD) contacts;
forming lower portions of active regions (ARs) on selected portions of corresponding BMD contacts, the lower portions including lower portions of first and second ARs separated relative to a first direction, each having a channel axis extending in a second direction perpendicular to the first direction;
regarding the lower portions of the first and second ARs, and relative to the second direction,
upper parts thereof representing channel regions, and
ends of lower parts thereof representing instances of a first source/drain (S/D) region correspondingly coupled to the first and second BMD contacts;
forming metal-to-gate (MG) contacts including first and second MG contacts correspondingly proximal to the channel regions of the first and second ARs and separated relative to the first direction;
forming a metal-to-gate (MP) contact at a same level as the first and second MG contacts relative to the second direction such that, relative to the first direction, the MP contact extending between and coupling together the first and second MG contacts; and
forming upper portions of ARs including upper portions of the first and second ARs correspondingly on the lower portions thereof, upper ends of the upper portions of the first and second ARs representing instances of a second S/D region; and
forming metal-to-source/drain (MD) contacts including first and second MD contacts correspondingly on and coupled to the instances of the second S/D region correspondingly of the first and second ARs;
the forming BMD contacts including:
substantially aligning selected portions of the first and second BMD contacts relative to a third direction perpendicular to each of first and second directions;
the forming lower portions including:
relative to the third direction, substantially aligning the first and second ARs correspondingly with the selected portions of the first and second BMD contacts; and
the forming a metal-to-gate (MP) contact including:
regarding at least a portion of the MP contact relative to the first direction,
extending the at least a portion of the MP contact substantially beyond each of the first and second ARs relative to the third direction.

13. The method of claim 12, wherein:
the BMD contacts further include a third BMD contact;
the lower portions of the ARs further include lower portions of a third AR having a channel axis extending in the second direction, an upper part thereof representing a channel region, and an end of a lower part thereof representing an instance of the first S/D region;
the forming lower portions includes:
locating the lower portion of the third AR over a selected portion of the third BMD contact; and
relative to the third direction, separating the third and first BMD contacts;
the MG contacts further include a third MG contact proximal to the channel region of the third AR; the forming a metal-to-gate (MP) contact includes: relative to the third direction, extending the at least a portion of the MP contact to at least partially overlap the third AR;
the upper portions of the ARs further include an upper portion of the third AR correspondingly on the lower portion thereof, an upper end of the upper portion of the third ARs representing an instance of the second S/D region; and
the MD contacts further include a third MD contact on and coupled to the instance of the second S/D region of the third AR.

14. The method of claim 12, wherein the forming a metal-to-gate (MP) contact includes:
relative to a reference plane defined by the first direction and a third direction perpendicular to each of first and second directions, constructing a shape of the MP contact to be an irregular polygon.

15. The method of claim 12, wherein the forming a metal-to-gate (MP) contact includes:
relative to a reference plane defined by the first direction and a third direction perpendicular to each of first and second directions, constructing a shape of the MP contact to be a concave polygon.

16. The method of claim 12, wherein:
a shape of the MP contact is a concave polygon.

17. The method of claim 12, wherein the forming a metal-to-gate (MP) contact includes:
relative to a reference plane defined by first and third directions, constructing a shape of the MP contact to be a polygon having N sides, where N is an even integer and 4≤N.

18. The method of claim 12, wherein:
the forming lower portions includes: constructing the lower portions to include lower portions of corresponding nanowires; and
the forming upper portions includes: constructing the upper portions to include upper portions of corresponding nanowires.

19. A semiconductor device comprising:
active regions (ARs) including first, second and third ARs each having a channel axis extending in a first direction, and each having a channel region between selected portions of overlying first and underlying second source/drain (S/D) regions relative to the first direction,
each of the ARs having a width axis extending in a second direction perpendicular to the first direction, and a thickness axis extending in a third direction perpendicular to the first and second directions, and
the width axes of the ARs being aligned to corresponding beta reference tracks (beta tracks) extending parallel to the second direction such that the first AR being aligned to a first beta track and each of the second and third ARs being aligned to a second beta track;

metal-to-gate (MG) contacts including first, second and third MG contacts correspondingly proximal to the channel regions of the first, second and third ARs;

metal-to-source/drain (MD) contacts including first and second MD contacts over and correspondingly coupled to the first S/D regions of the first and second ARs;

buried MD (BMD) contacts including first and second buried BMD contacts under and correspondingly coupled to the second S/D regions of the first and second ARs;

metal-to-gate (MP) contacts at a same level as the MG contacts relative to the second direction, the MP contacts including first and second metal-to-gate (MP) contacts extending between and coupling together the first and second MG contacts relative to the first direction;

M_1st segments in an M_1st layer of metallization having long axes extending in the third direction and aligned correspondingly to alpha reference tracks (alpha tracks) extending in the third direction, the M_1st segments including first and second M_1st segments correspondingly aligned to adjacent first and second alpha tracks; and via-to-M_1st (V_1st) contacts including first and second V_1st contacts over the first and second M_1st segments, aligned correspondingly to the first and second alpha tracks and to a first one of the beta tracks (first beta track).

20. The device of claim 19, wherein:

the ARs further include fourth and fifth ARs, each of the fourth and fifth ARs being aligned to a third beta track;

the MG contacts further include fourth and fifth MG contacts correspondingly proximal to the channel regions of the fourth and fifth ARs;

the MD contacts further include third and fourth MD contacts over and correspondingly coupled to the first S/D regions of the fourth and fifth ARs;

the BMD contacts further including third and fourth buried BMD contacts under and correspondingly coupled to the second S/D regions of the fourth and fifth ARs;

the MP contacts further include a third MP contact extending between and coupling together the fourth and fifth MG contacts relative to the first direction;

the M_1st segments including a third and fourth M_1st segments correspondingly aligned to the second alpha track;

each of the third and fourth M_1st segments is free from being intersected by any of the beta tracks other than correspondingly second and third ones of the beta tracks (second and third beta tracks); and the V_1st contacts further include third and fourth V_1st contacts over the third and fourth M_1st segments, aligned to the second alpha track and correspondingly to the second and third beta tracks.

* * * * *